(12) United States Patent
Lee et al.

(10) Patent No.: US 12,448,534 B2
(45) Date of Patent: Oct. 21, 2025

(54) METHOD OF FORMING HOLE INJECTION LAYER, HOLE INJECTION LAYER INK COMPOSITION, AND LIGHT-EMITTING DEVICE MANUFACTURED BY USING HOLE INJECTION LAYER INK COMPOSITION

(71) Applicant: Samsung Display Co., Ltd., Yongin-si (KR)

(72) Inventors: Juyon Lee, Yongin-si (KR); Sehun Kim, Yongin-si (KR); Hyojin Ko, Yongin-si (KR); Heunggyu Kim, Yongin-si (KR); Wonjun Park, Yongin-si (KR); Junbo Sim, Yongin-si (KR); Seungmook Lee, Yongin-si (KR); Jaekook Ha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 943 days.

(21) Appl. No.: 17/393,435

(22) Filed: Aug. 4, 2021

(65) Prior Publication Data

US 2022/0162467 A1 May 26, 2022

(30) Foreign Application Priority Data

Nov. 24, 2020 (KR) ........................ 10-2020-0159090

(51) Int. Cl.
| | | |
|---|---|---|
| *C09D 11/50* | (2014.01) | |
| *C09D 11/38* | (2014.01) | |
| *G03F 7/42* | (2006.01) | |
| *H10K 50/17* | (2023.01) | |
| *H10K 71/00* | (2023.01) | |
| *H10K 71/13* | (2023.01) | |
| *H10K 85/60* | (2023.01) | |

(52) U.S. Cl.
CPC .............. *C09D 11/50* (2013.01); *C09D 11/38* (2013.01); *G03F 7/427* (2013.01); *H10K 50/17* (2023.02); *H10K 71/135* (2023.02); *H10K 85/626* (2023.02); *H10K 85/633* (2023.02); *H10K 71/00* (2023.02)

(58) Field of Classification Search
CPC .. H10K 85/633; H10K 71/135; H10K 85/626; H10K 50/17
See application file for complete search history.

(56) References Cited

U.S. PATENT DOCUMENTS

| | | |
|---|---|---|
| 7,490,922 B2 | 2/2009 | Lee |
| 9,391,304 B2 * | 7/2016 | Lee .................. H10K 59/122 |

(Continued)

FOREIGN PATENT DOCUMENTS

| | | |
|---|---|---|
| CN | 109873086 A | 6/2019 |
| JP | 2006318781 A | 11/2006 |

(Continued)

OTHER PUBLICATIONS

English Abstract of CN 109873086.

(Continued)

*Primary Examiner* — Robert A Vetere
(74) *Attorney, Agent, or Firm* — CANTOR COLBURN LLP

(57) ABSTRACT

A method of forming a hole injection layer, a hole injection layer ink composition, and a light-emitting device manufactured by using the hole injection layer ink composition.

15 Claims, 2 Drawing Sheets

(56) References Cited

U.S. PATENT DOCUMENTS

| | | | |
|---|---|---|---|
| 11,342,505 B2 | 5/2022 | Yoon et al. | |
| 2006/0257686 A1 | 11/2006 | Shimizu et al. | |
| 2018/0351127 A1 | 12/2018 | So et al. | |
| 2019/0016666 A1* | 1/2019 | Jeong | H10K 50/171 |
| 2019/0019958 A1* | 1/2019 | Kim | H10K 85/111 |
| 2020/0071549 A1* | 3/2020 | Béalle et al. | C09D 11/50 |

FOREIGN PATENT DOCUMENTS

| | | |
|---|---|---|
| JP | 2013084888 A | 5/2013 |
| KR | 1020160045998 A | 4/2016 |
| KR | 20190082183 A | 7/2019 |
| KR | 20190113498 A | 10/2019 |

OTHER PUBLICATIONS

English Abstract of JP 2013-084888.
Thickening and Thixotropy Agents (Deuteron) (www.deuteron.com/en/produkt-kategorie/thickening-and-thixotropy-agents.

* cited by examiner

METHOD OF FORMING HOLE INJECTION LAYER, HOLE INJECTION LAYER INK COMPOSITION, AND LIGHT-EMITTING DEVICE MANUFACTURED BY USING HOLE INJECTION LAYER INK COMPOSITION

CROSS-REFERENCE TO RELATED APPLICATION

This application is claims priority to Korean Patent Application No. 10-2020-0159090 filed on Nov. 24, 2020, in the Korean Intellectual Property Office, and all the benefits accruing therefrom under 35 U.S.C. § 119, the disclosure of which is incorporated herein by reference in its entirety.

BACKGROUND

Field

A method of forming a hole injection layer, a hole injection layer ink composition, and a light-emitting device manufactured by using the hole injection layer ink composition.

Description of the Related Art

Among display devices, organic light-emitting display devices are attracting attention as next-generation display devices because organic light-emitting display devices have wide viewing angles, high contrast ratios, and relatively, short response times. Organic light-emitting display devices, thin-film transistors and organic light-emitting devices (OLEDs) are formed on a substrate and light is emitted from the OLEDs. The OLEDs are sometimes used as display units for small products such as mobile phones, tablets, or laptops, or as display units for large products such as televisions or signage.

OLEDs include a pixel electrode, a counter electrode, and an organic emission layer between the two electrodes. The organic emission layer of the OLED may be formed by various methods, e.g., chemical vapor deposition (CVD), an inkjet method, or the like.

SUMMARY

One or more embodiments include a method of forming a hole injection layer of a light-emitting device by using a hole injection layer ink composition with improved wettability on an electrode from which a residue is removed, a hole injection layer ink composition used in the forming of the hole injection layer, and a light-emitting device manufactured by using the hole injection layer ink composition. Additional aspects will be set forth in part in the description which follows and, in part, will be apparent from the description, or may be learned by practice of the presented embodiments of the disclosure.

According to one or more embodiments, a method of forming a hole injection layer of a light-emitting device, in which the method may include
  forming a pixel electrode on a substrate,
  coating the pixel electrode with a composition to provide a pixel-defining film on the pixel electrode,
  forming by photolithography a patterned pixel-defining film having an opening that may expose a portion of the pixel electrode,
  descumming, and
  forming a hole injection layer on the exposed and descummed pixel electrode.

According to one or more embodiments, a hole injection layer ink composition may include a hole injection layer compound, a solvent, and a polymer compound including a group represented by Formula 1.

Formula 1

In Formula 1,

X may be a single bond or a divalent organic linking group, $R_1$ may be a $C_1$-$C_{10}$ alkylene group that is unsubstituted or substituted with at least one $R_{10a}$, $R_2$ may be hydrogen, deuterium, a hydroxyl group, a $C_1$-$C_{60}$ alkyl group that is unsubstituted or substituted with at least one of $R_{10a}$, a $C_2$-$C_{60}$ alkenyl group that is unsubstituted or substituted with at least one of $R_{10a}$, a $C_2$-$C_{60}$ alkynyl group that is unsubstituted or substituted with at least one of $R_{10a}$, a $C_1$-$C_{60}$ alkoxy group that is unsubstituted or substituted with at least one of $R_{10a}$, and a $C_1$-$C_{60}$ alkylether group that is unsubstituted or substituted with at least one of $R_{10a}$, n1 may be an integer from 2 to 100, and

* indicates a connection site to the polymer compound,
  each $R_{10a}$ is independently deuterium, —F, —Cl, —Br, —I, a hydroxyl group, a cyano group, or a nitro group;
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;
  a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each of which is independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or
  —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
  wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each of which is independently unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

According to one or more embodiments, a light-emitting device may include a first electrode and a second electrode each having a surface opposite the other, and an interlayer between the first electrode and the second electrode and including an emission layer, wherein the interlayer may include a hole injection layer, and the hole injection layer may be manufactured by using the hole injection layer ink composition.

According to one or more embodiments, a display apparatus may include the light-emitting device.

Other aspects and features other than those described above will become apparent from the detailed description, claims, and drawings in the following.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
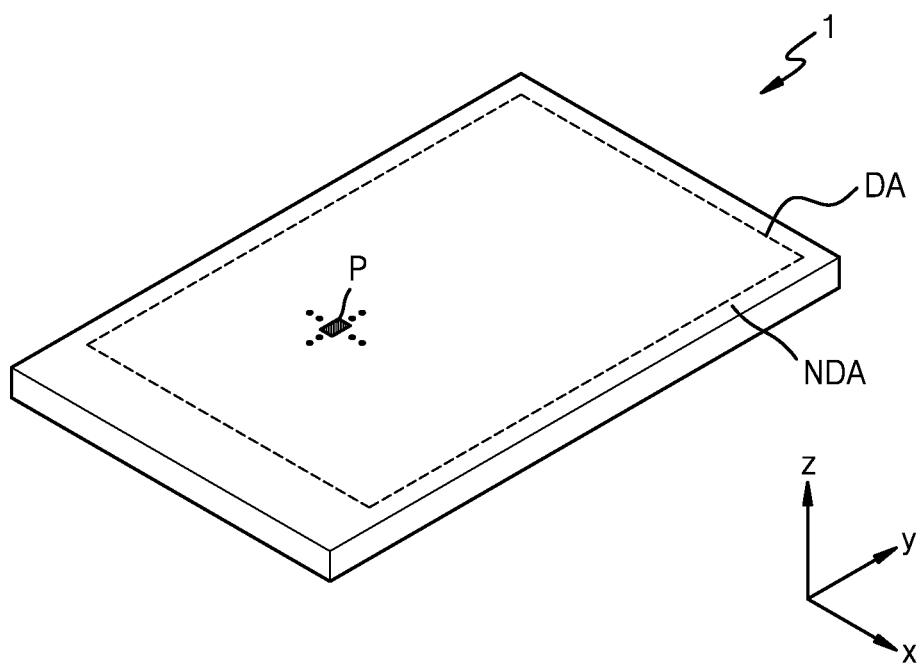
FIG. 1 is a schematic perspective view illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Rather, these embodiments are provided so that this disclosure will be thorough and complete, and will fully convey the scope of the invention to those skilled in the art. Accordingly, the embodiments are merely described below, by referring to the figures, to explain aspects of the present description.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof. Likewise, in the present specification, "A and/or B" refers to A or B, or A and B. In the present specification, "at least one of A and B" refers to A or B, or A and B.

It will be further understood that the terms "comprises" and/or "comprising," or "includes" and/or "including" or "having" when used in this specification or claims, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "on" or "onto" another layer, region, or component, it may be directly or indirectly formed over the other layer, region, or component. That is, for example, intervening layers, regions, or components may be present. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments are not limited thereto.

When a specific example may be implemented differently, a specific process order may be performed differently from the described order. For example, two processes described in succession may be performed substantially simultaneously or may be performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

The x-axis, y-axis, and z-axis are not limited to three axes on the orthogonal coordinates system, and may be interpreted in a broad sense including the orthogonal coordinates system. For example, the x-axis, y-axis, and z-axis may be orthogonal to each other, but the x-axis, y-axis, and z-axis may also refer to different directions that are not orthogonal to each other.

A display apparatus according to embodiments may be described as an organic light-emitting display apparatus. In some embodiments, the display apparatus according to embodiments may be a display apparatus such as an inorganic light-emitting display apparatus, an inorganic electroluminescence (EL) display apparatus, a quantum dot light-emitting display apparatus. For example, the emission layer provided in the display apparatus 1 of FIG. 1 may include an organic material, a quantum dot, or an organic material and a quantum dot.

FIG. 1 is a schematic perspective view illustrating a display apparatus according to an embodiment.

As shown in FIG. 1, the display apparatus 1 may include a display area DA that may realize an image and a non-display area NDA that may not realize an image. The display apparatus 1 may provide an image by using light emitted from a plurality of pixels P within the display area DA.

In FIG. 1, the display area DA in the display apparatus 1 is shown in a rectangular form, but embodiments are not limited thereto. The shape of the display area DA may be in a circular shape, an oval shape, or a polygonal shape such as a triangular shape or a pentagonal shape. In addition, while the display apparatus 1 shown in FIG. 1 is shown as a flat-panel display apparatus in a flat form, however, it is apparent that the display apparatus 1 may be implemented in various forms such as part of a flexible or foldable display apparatus.

Figure 2:
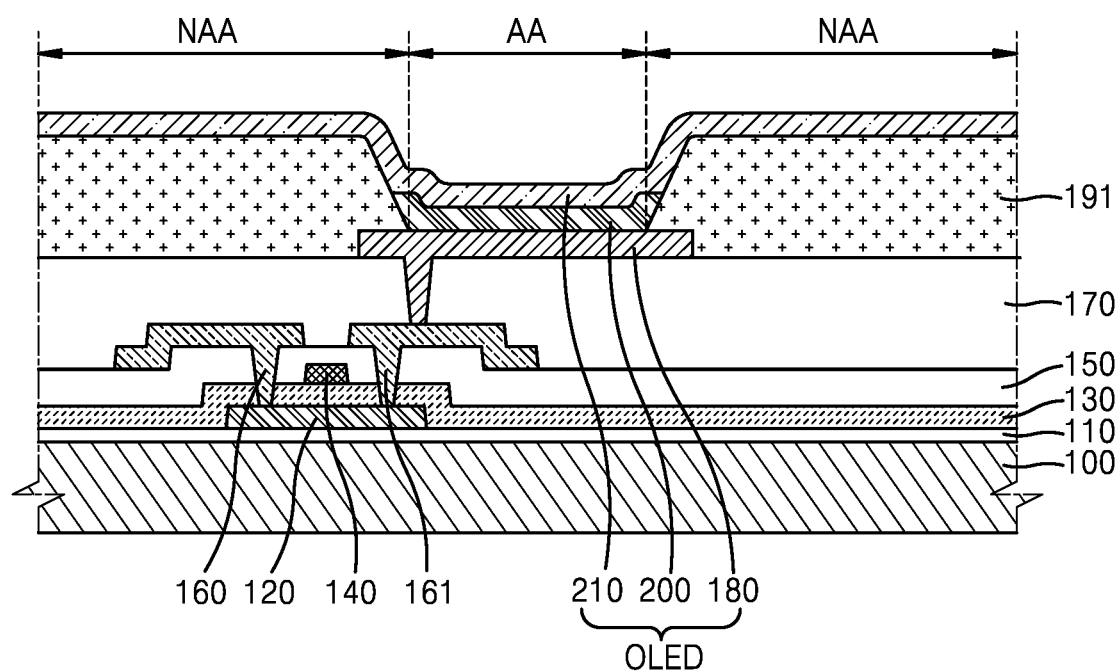
FIG. 2 is a schematic cross-sectional view illustrating a display apparatus according to an embodiment.

FIG. 2 is a schematic cross-sectional view illustrating a display apparatus according to an embodiment. As shown in FIG. 2, the display apparatus according to one or more embodiments may include: a substrate 100; a pixel electrode 180 on the substrate 100; and a pixel-defining film 191 on the pixel electrode 180, the pixel-defining film 191 having an opening that may expose a portion, optionally a central portion, of the pixel electrode 180.

The substrate 100 may include glass or a polymer resin. The polymer resin may include polyether sulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP). The substrate 100 including the polymer resin may possess flexible, rollable, or bendable characteristics. The substrate 100 may have a multilayer structure including a layer including the polymer resin and an inorganic layer (not shown).

A buffer layer 110 may be disposed on the substrate 100 to planarize the upper surface of the substrate 100 and may function to block impurities from entering from the substrate 100. The buffer layer 110 may include at least one of silicon oxide ($SiO_X$), silicon nitride ($SiN_X$), and silicon oxynitride ($SiO_XN_Y$).

The active layer 120 may be on the buffer layer 110. The active layer 120 may include an oxide semiconductor and/or a silicon semiconductor. When the active layer 120 is formed of an oxide semiconductor, the active layer 120 may include at least one of an oxide of indium (In), gallium (Ga), tin (Sn), zirconium (Zr), vanadium (V), hafnium (Hf) cadmium (Cd), germanium (Ge) chromium (Cr), titanium (Ti), or zinc (Zn). For example, the active layer 120 may be an ITZO (InSnZnO) active layer or an IGZO (InGaZnO) active layer. When the active layer 120 is formed of a silicon semiconductor, the active layer 120 may include, for example, amorphous silicon (a-Si) or low temperature polysilicon (LTPS).

A gate electrode 140 may be positioned on the active layer 120, and a first insulating layer 130 may be positioned between the gate electrode 140 and the active layer 120. The gate electrode 140 may be formed of at least one metal selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu) in a single layer or multiple layers. The gate electrode 140 may be connected to a gate line (not shown) applying an electrical signal to the gate electrode 140.

A source electrode 160 and/or a drain electrode 161 may be on the gate electrode 140, with a second insulating layer 150 may be between the two. The source electrode 160 and/or drain electrode 161 may be electrically connected to the active layer 120 through contact holes formed in the second insulating layer 150 and the first insulating layer 130.

As shown in FIG. 2, a third insulating layer 170 may be on the second insulating layer 150. In FIG. 2, the third insulating layer 170 is shown as a single layer, however, the third insulating layer 170 may be formed as a multilayer. The third insulating layer 170 may planarize an upper surface of pixel circuits (PC), thereby planarizing a surface where the organic light-emitting device (OLED) will be located.

The third insulating layer 170 may include, for example, a commonly used polymer, such as a benzocyclobutene (BCB), polyimide, hexamethyl disiloxane (HMDSO), polymethyl methacrylate (PMMA), or polystyrene (PS), a polymer derivative having a phenol-based group, an acrylic polymer, an imide-based polymer, an arylether-based polymer, an amide-based polymer, a fluorine-based polymer, a p-xylene-based polymer, a vinyl alcohol-based polymer, and a mixture thereof. As another example, the third insulating layer 170 may contain organic and inorganic materials.

The pixel electrode 180 may be on the third insulating layer 170. The pixel electrode 180 may be a (semi)transmissive electrode or a reflective electrode. The pixel electrode 180 may be electrically connected to the PC through a contact hole formed in the third insulating layer 170.

In some embodiments, the pixel electrode 180 may include a reflection film formed of Ag, Mg, Al, Pt, Pd, Au, Ni, Nd, Ir, Cr, or a compound or alloy of each thereof, and a transparent or a semi-transparent electrode layer on the reflection film. The transparent or a semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). For example, the pixel electrode 180 may include a stack structure of ITO/Ag/ITO.

The pixel-defining film 191 may be positioned on the pixel electrode 180. As the pixel-defining film 191 may have an opening that may expose a portion, optionally a central portion, of the pixel electrode 180, the pixel-defining film 191 may define an emission area of a pixel. In addition, as the pixel-defining film 191 may increase a distance between an edge portion of the pixel electrode 180 and a counter electrode 210 on the pixel electrode 180, the pixel-defining film 191 may prevent occurrence of arc or the like at the edge portion of the pixel electrode 180. The pixel-defining film 191 may be formed by curing a common composition for a pixel-defining film, and the composition for a pixel-defining film may include a photoinitiator, an alkali-soluble resin, a liquid repellent, a development protectant, and a solvent.

During the inkjet process, an upper layer of the pixel-defining film 191 may have liquid-repellent character such that a light-emitting material or the like may not be applied to the non-emission area NAA.

The interlayer 200 may be on the pixel electrode 180 exposed by the pixel-defining film 191. The interlayer 200 may include a hole injection layer. The interlayer 200 may include an organic emission layer, and may optionally further include a functional layer such as a hole transport layer, an electron transport layer, and an electron injection layer on and under the organic emission layer.

The organic emission layer may include an organic material including a fluorescent material or a phosphorescent material that may emit red, green, blue, or white light. The organic emission layer may be formed of a low molecular weight organic material or a high molecular weight organic material.

The pixel electrode 180 may be provided as a plurality of pixel electrodes, and the interlayer 200 may be arranged to correspond to each of the plurality of pixel electrodes 180. However, embodiments are not limited thereto. The interlayer 200 may be modified in various ways, such as an interlayer including an integral layer over the plurality of pixel electrodes 180. In some embodiments, the organic emission layer may each be arranged to correspond to each of the plurality of pixel electrodes 180, and the functional layer(s) excluding the organic emission layer may be integrally formed over the plurality of pixel electrodes 180.

The counter electrode 210 may be disposed on the interlayer 200. The counter electrode 210 may be a transmissive electrode or a reflective electrode. In some embodiments, the counter electrode 210 may be a transparent or a semi-transparent electrode, and the counter electrode 210 may be formed of a metal thin film having a low work function and including Li, Ca, LiF/Ca, LiF/Al, Al, Ag, Mg, or a compound or alloy thereof.

As an optional example, a transparent conductive oxide (TCO) film, such as ITO, IZO, ZnO, or $In_2O_3$, may be further disposed on the counter electrode 210. The counter electrode 210 may be disposed over the display area DA and the non-display area NDA, and the counter electrode 210 may be disposed on the interlayer 200 and the pixel-defining film 191. The counter electrode 210 may be integrally formed in a plurality of organic light-emitting devices (OLEDs) to correspond to a plurality of the pixel electrodes 180.

When the pixel electrode 180 is provided as a reflective electrode, and the counter electrode 210 is provided as a transmissive electrode, light emitted from the interlayer 200 may be emitted toward the counter electrode 210 such that the display apparatus 1 may be of a top-emission type.

In some embodiments, when the pixel electrode 180 is provided as a transparent electrode or a semi-transparent electrode, and the counter electrode 210 is provided as a reflective electrode, light emitted from the interlayer 200 may be emitted toward the substrate 100 such that the display apparatus 1 may be of a bottom-emission type. However, embodiments are not limited thereto, and the display apparatus 1 of this embodiment may be in a light-emitting type that may emit light in both top and bottom directions.

According to an embodiment, the counter electrode 210 may be formed as a low reflection layer. Since the counter electrode 210 may be disposed not only in the non-emission area NAA but also in the emission area AA, light reflectance may be decreased in the emission area AA, thereby reducing light reflectance of the entire display apparatus 1.

A thin film encapsulation layer (not shown) may be formed on the counter electrode 210. The thin film encapsulation layer may include at least one organic layer and at least one inorganic layer. In the top-emitting type display apparatus 1 according to one or more embodiments, the thin film encapsulation layer may be on an OLED, and light emitted from the OLED may be admitted to the outside through the thin film encapsulation layer.

A method of forming a hole injection layer of a light-emitting device according to one or more embodiments may include: forming a pixel electrode on a substrate; coating the pixel electrode with a composition to provide a pixel-defining film on the pixel electrode; forming by photolithography a patterned pixel-defining film having an opening that may expose a portion, e.g., central portion, of the pixel electrode; descumming; and forming a hole injection layer on the exposed and descummed pixel electrode.

The forming of the pixel-defining film on the pixel electrode may be performed by a general photolithography method well known to those of ordinary skill, and therefore, more detailed information of the photolithography step is omitted.

When forming a pixel-defining film, a residual film of components of the composition for a pixel-defining film may be formed on an upper surface of the pixel electrode, or a residue may exist. When a residual film or a residue is present on the pixel electrode, the residual film or the residue on the pixel electrode may be removed by descumming, because the residual film or the residue may affect to the luminescence efficiency and lifespan of the light-emitting device. Following the formation of a hole injection layer, a hole transport layer, an emission layer, an electron transport layer, and a counter electrode is formed to make a light emitting device.

The descumming may include plasma treatment, UV treating, and/or $O_3$ treating.

In some embodiments, the descumming may include plasma treatment.

In some embodiments, the descumming may include plasma treatment with fluorine-containing gas.

In some embodiments, the descumming may include plasma treatment with $CF_4$, $NF_3$, $SF_6$, $C_3F_8$, $C_4F_8$, or a combination thereof.

In some embodiments, the descumming may include plasma treatment with $O_2$, $N_2$, or a combination thereof; and plasma treatment with $CF_4$, $NF_3$, $SF_6$, $C_3F_8$, $C_4F_8$, or a combination thereof.

When forming an interlayer by a solution process, e.g., an inkjet method, the surface if the films around a light-emitting area, e.g., a pixel-defining film, have liquid repellency. After the pixel-defining film is formed, the residue present on an upper surface of the pixel electrode may be removed by a plasma treatment, for example, by $O_2$, $N_2$, or a combination thereof. The plasma treatment may not be done selectively, but may be performed on both the pixel electrode and the pixel-defining film.

For example, the plasma treatment may be performed by $O_2$ plasma. $O_2$ plasma refers to a generated plasma that is primarily derived from oxygen, and other gases (e.g., $N_2$) other than oxygen may be mixed together as a plasma gas raw material. For example, $O_2$ and $N_2$ may respectively be used as a reaction gas and a carrier gas. By adjusting variables such as gas flow ratio, power, pressure, and reaction time, conditions may be optimized for the plasma treatment of the pixel-defining film. Because the plasma-treated pixel electrode and the pixel-defining film by $O_2$, $N_2$, or a combination thereof may be both water-soluble, liquid repellency may be imparted to the pixel-defining film by additional plasma treatment with a fluorine-containing gas.

The fluorine-containing gas may include, for example, $CF_4$, $NF_3$, $SF_6$, $C_3F_8$, $C_4F_8$ or a combination thereof. For example, the descumming may include plasma treatment with a fluorine-containing gas, without plasma treatment with $O_2$, $N_2$ or a combination thereof. Again, because plasma treatment with a fluorine-containing gas may not be selectively performed, the pixel electrode and the pixel-defining film plasma-treated with fluorine-containing gas may be both liquid-repellent.

The upper portion of a surface of a pixel-defining film having liquid repellency may have a contact angle of 55° or more. For example, the contact angle of the upper portion a surface of a of the pixel-defining film may be in a range of about 55° to about 110°.

In some embodiments, the forming of the hole injection layer on the pixel electrode may be performed by a solution process, for example, an inkjet process. When forming a hole injection layer on a liquid-repellent pixel electrode by a solution process, e.g., by an inkjet method, the hole injection layer composition of the related art may have a problem due to insufficient wettability. To solve the lack of wettability, the hole injection layer composition that is ejected onto the pixel electrode by inkjet, e.g., in the form of a spray or aerosol, may have a high viscosity. When the hole injection layer composition is ejected by an inkjet, and if the viscosity is too high, an ejection problem may occur.

In some embodiments, in the method of forming a hole injection layer of a light-emitting device, the forming of the hole injection layer on the pixel electrode may be performed by using a hole injection layer composition, wherein the hole injection layer composition may include a hole injection layer compound, a solvent, and a polymer compound, and the polymer compound and the solvent may form a reversible network structure by hydrogen bonding.

To 'form a reversible network structure' means that when an external shear force is applied to a composition, a viscosity of the composition may be relatively lower than if a smaller or no external shear force is applied. To 'form a reversible network structure' refers to a case where a viscosity of a composition may be in a range of about 30 centipoises (cP) to about 1,000 cP at a shear rate in a range of about 0.05 reciprocal seconds ($s^{-1}$) to about 0.15 $s^{-1}$, and a viscosity may be in a range of about 7 cP to about 13 cP at a shear rate in a range of about 70 $s^{-1}$ to 130 $s^{-1}$. For example, to 'form a reversible network structure' refers to a case where a composition may exhibit a viscosity in a range of about 30 cP to about 1,000 cP at a shear rate of 0.1 $s^{-1}$, and a viscosity in a range of about 7 cP to about 13 cP at a shear rate of 100 $s^{-1}$.

Theoretically, the point where no external force is applied to a composition would correspond to a shear rate of 0 $s^{-1}$, however, a viscosity at 0 $s^{-1}$ may not, in principle, be measured. Thus, in the present specification, the viscosity at 0.1 $s^{-1}$ is defined as the value of viscosity at the point where no external shear force is applied to a composition.

In addition, a shear rate of 100 $s^{-1}$ may be defined as the shear rate in a deposition solution process, e.g., an inkjet printing process. In the case of inkjet printing, the application state in a solution process means an inkjet ejection state. For example, a shear rate in an ejection state may be determined by an ejection pressure. It is apparent to those skilled in the art that the shear rate in an application state in a solution process may be changed according to the process conditions. However, in the present specification, the viscosity at 100 $s^{-1}$ is defined as the value of a viscosity of the application or ejection state in a solution process.

In some embodiments, the hole injection layer composition may include a hole injection layer compound, a solvent, and an organic thickener that is a polymer compound, and
the polymer compound may include at least one group represented by Formula 1:

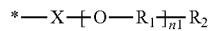

Formula 1 wherein, in Formula 1,

X may be a single bond or a divalent organic linking group, $R_1$ may be a $C_1$-$C_{10}$ alkylene group that is unsubstituted or substituted with at least one of $R_{10a}$, $R_2$ may be selected from hydrogen, deuterium, a hydroxyl group, a $C_1$-$C_{60}$ alkyl group that is unsubstituted or substituted with at least one of $R_{10a}$, a $C_2$-$C_{60}$ alkenyl group that is unsubstituted or substituted with at least one of $R_{10a}$, a $C_2$-$C_{60}$ alkynyl group that is unsubstituted or substituted with at least one of $R_{10a}$, a $C_1$-$C_{60}$ alkoxy group that is unsubstituted or substituted with at least one of $R_{10a}$, and a $C_1$-$C_{60}$ alkylether group that is unsubstituted or substituted with at least one of $R_{10a}$, n1 may be an integer from 2 to 100, and

* indicates a connection site to the polymer compound, and each $R_{10a}$ may be independently deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each of which is independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each of which is independently unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, X may be a single bond.

In an embodiment, when X is a divalent organic linking group, X may be selected from a $C_1$-$C_{20}$ alkylene group that is unsubstituted or substituted with at least one of $R_{10a}$; a $C_1$-$C_{20}$ alkylene group that is unsubstituted or substituted with at least one of $R_{10a}$, in which at least one methylene (—CH$_2$—) is substituted with sulfonyl (—SO$_2$—), carbonyl (CO), ether (—O—), sulfide (—S—), sulfoxide (—SO—), ester (—C(=O)O—), amide (—C(=O)NR—) (wherein R may be hydrogen or a $C_1$-$C_{10}$ alkyl group), or a combination thereof; a $C_2$-$C_{20}$ alkenylene group that is unsubstituted or substituted with at least one of $R_{10a}$; a $C_3$-$C_{10}$ cycloalkylene group that is unsubstituted or substituted with at least one of $R_{10a}$; a $C_1$-$C_{60}$ heterocycloalkylene that is group unsubstituted or substituted with at least one of $R_{10a}$; a $C_3$-$C_{10}$ cycloalkenylene group that is unsubstituted or substituted with at least one of $R_{10a}$; a $C_1$-$C_{10}$ hetero-cycloalkenylene group that is unsubstituted or substituted with at least one of $R_{10a}$; a $C_6$-$C_{60}$ arylene group that is unsubstituted or substituted with at least one of $R_{10a}$; a $C_1$-$C_{60}$ heteroarylene group that is unsubstituted or substituted with at least one of $R_{10a}$; a divalent non-aromatic condensed polycyclic group that is unsubstituted or substituted with at least one of $R_{10a}$; and a divalent non-aromatic condensed hetero-polycyclic group that is unsubstituted or substituted with at least one of $R_{10a}$.

In Formula 1, n1 may be a repeating unit represented by —[O—$R_1$]—, and at least two —[O—$R_1$]— may be identical to or different from each other.

For example, $R_2$ may be a $C_1$-$C_{20}$ alkyl group in which a hydroxyl group is substituted or a $C_1$-$C_{20}$ alkylether group in which a hydroxyl group is substituted. For example, $R_2$ may be a $C_1$-$C_{20}$ alkyl group in which a hydroxyl group is substituted at a terminus or a $C_1$-$C_{20}$ alkylether group in which a hydroxyl group is substituted at a terminus.

The hole injection layer compound refers to a compound that may be included in a hole transport region in the interlayer 200 described herein.

In some embodiments, the polymer compound comprises the at least one group represented by Formula 1 in at least one side chain or at least one terminus of the polymer compound. In some embodiments, the polymer compound may include the at least one group represented by Formula 1 in a terminus of the polymer compound.

In some embodiments, the polymer compound may include a polyurethane unit, a polyamide unit, a polyurea unit, or any combination thereof. For example, the polymer compound may include polyurethane-polyurea or polyamide-polyurea.

For example, the polymer compound may be an end-modified polyurethane, an end-modified polyamide, or an end-modified polyurea, each having a terminal structure represented by Formula 1.

In some embodiments, the polymer compound may be a urea-modified polyurethane or urea-modified polyamide, each including a group represented by Formula 1 in a terminus.

In some embodiments, in Formula 1, $R_2$ may be a group represented by Formula 2:

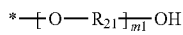

Formula 2 wherein, in Formula 2, $R_{21}$ may be a $C_1$-$C_{10}$ alkylene group that is unsubstituted or substituted with at least one of $R_{10a}$, m1 may be an integer from 1 to 10,

* indicates a connection site to an adjacent atom of the polymer, and $R_{10a}$ may be understood by referring to the description of $R_{10a}$ of Formula 1.

In some embodiments, the polymer compound including at least one group represented by Formula 3:

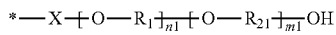

Formula 3 wherein, in Formula 3,

X may be a single bond or a divalent organic linking group, $R_1$ and $R_{21}$ may each independently be a $C_1$-$C_{10}$ alkylene group that is unsubstituted or substituted with at least one of $R_{10a}$, n1 may be an integer from 2 to 100, m1 may be an integer from 1 to 10,

* indicates a connection site to the polymer compound, and $R_{10a}$ may be understood by referring to the description of $R_{10a}$ of Formula 1.

In an embodiment, a number average molecular weight (Mn) of the polymer compound may be in a range of about 100 to about 100,000 grams per mole (g/mol), and a weight average molecular weight (Mw) of the polymer compound may be in a range of about 1,500 to about 1,000,000 g/mol.

In an embodiment, the polymer compound and the solvent may form a reversible network structure by hydrogen bonding. The 'reversible network structure' may be understood by referring to the description of the 'reversible network structure' provided herein.

In an embodiment, the solvent may include a functional group capable of hydrogen-bonding with the polymer compound.

The solvent may include a functional group capable of hydrogen-bonding with the polymer compound such that the polymer compound and the solvent may form a reversible network structure. For example, the solvent may include a hydroxyl group, a carbonyl group, an amino group, a carboxyl group, an alkoxy group, an ether group, an ester group, or a combination thereof.

In an embodiment, the solvent may include at least one selected from: alkylene glycol alkylethers such as ethylene glycol monomethylether, ethylene glycol monoethylether, ethylene glycol monopropylether, ethylene glycol monobutylether, propylene glycol monomethylether, and propylene glycol methylethylether; diethylene glycol dialkylethers such as diethylene glycol dimethylether, diethylene glycol diethylether, diethylene glycol dipropylether, and diethylene glycol dibutylether; triethylene glycol monoalkylethers such as triethylene glycol monomethylether, triethylene glycol monoethylether, triethylene glycol monopropylether, and triethylene glycol monobutylether; triethylene glycol dialkylethers such as triethylene glycol dimethylether, triethylene glycol diethylether, triethylene glycol dipropylether, and triethylene glycol dibutylether; aromatic ethers such as ethylene glycol monophenylether, and diethylene glycol monophenylether; alkylene glycol alkylether acetates such as methyl cellosolve acetate, ethyl cellosolve acetate, propylene glycol monomethylether acetate, propylene glycol monoethylether acetate, and propylene glycol monopropylether acetate; alkoxyalkyl acetates such as methoxybutyl acetate, and methoxypentyl acetate; ketones such as methylethyl ketone, acetone, methylamyl ketone, methylisobutylketone, and cyclohexanone; alcohols such as ethanol, propanol, butanol, hexanol, cyclohexanol, ethylene glycol, glycerin; esters such as 3-ethoxypropionate ethyl and 3-methoxypropionate methyl; and cyclic esters such as γ-butyrolactone.

For example, the solvent may be diethylene glycol monophenylether.

The solvent may be used alone or in a combination of at least two or more solvents.

When the ink composition includes, for example, an end-modified polyamide having a terminal structure represented by Formula 1 as an polymer compound and an alkylene glycol alkylether solvent as a solvent, the polymer compounds may interact with each other via hydrogen bonds between —NH groups and carbonyl groups in side chains of the polymer. In addition, since the polymer compound and the solvent also form a hydrogen bond, the polymer compound and the solvent molecule may form a three-dimensional reversible network structure by hydrogen bond with each other in the ink composition.

In a state where no external force, e.g., no external shear force, is applied to the ink composition, the three-dimensional network structure of the ink composition may be maintained, but when an external force is applied to the ink composition, hydrogen bonds between molecules may be broken, and thus the three-dimensional network structure may be disrupted. Accordingly, the ink composition may have thixotropic properties.

In an embodiment, a content of the polymer compound in the ink composition may be in a range of about 0.05 percent by weight (wt %) to about 1 wt %, or for example, about 0.1 wt % to about 0.5 wt %, based on the total weight of the ink composition.

When the number average molecular weight (Mn), the weight average molecular weight (Mw), and the content of the polymer compound are respectively within these ranges, the hole injection layer ink composition may have a high viscosity without external force applied, and the hole injection layer ink composition may have a relatively low viscosity with external force applied.

Examples of the polymer compounds include RHEOBYK-100, RHEOBYK-405, RHEOBYK-410, RHEOBYK-411, RHEOBYK-415, RHEOBYK-420, RHEOBYK-425, RHEOBYK-428, RHEOBYK-430, RHEOBYK-431, RHEOBYK-440, RHEOBYK-7405, RHEOBYK-7410 ET, RHEOBYK-7411 ES, RHEOBYK-7420 ES, RHEOBYK-7590, RHEOBYK-7594, RHEOBYK-7600, RHEOBYK-7610, RHEOBYK-D 410, RHEOBYK-D 420, RHEOBYK-H 400, RHEOBYK-H 600, RHEOBYK-H 3300 VF, RHEOBYK-H 6500 VF, RHEOBYK-H 7500 VF, RHEOBYK-H 7625 VF, RHEOBYK-HV 80, RHEOBYK-L 100, RHEOBYK-L 1400 VF, RHEOBYK-M 2600 VF, RHEOBYK-R 605, RHEOBYK-R 606, RHEOBYK-R 607, RHEOBYK-T 1000 VF, RHEOBYK-T 1010 VF, and RHEOBYK-TVS VF available from BYK (Germany), but embodiments are not limited thereto.

Examples of the polymer compound include Rheovis-PU 1190, Rheovis-PU 1191, Rheovis-PU 1291, Rheovis-PU 1214, Rheovis-PU 125, Rheovis-PU 1331, Rheovis-PU 1330, Rheovis-1331, Rheovis-HS 1162, Rheovis-HS 1152, Rheovis-HS 1169, Rheovis-HS 1212, Rheovis-HS 1332, Rheovis-AS 1130, and Rheovis-AS 1125 available from BASF (Germany), but embodiments are not limited thereto.

Hole Transport Region in Interlayer 200

The hole transport region included in the interlayer may have i) a single-layered structure consisting of a single layer consisting of a single material, ii) a single-layered structure consisting of a single layer including a plurality of different materials, or iii) a multi-layered structure having a plurality of the same or different layers including a plurality of different materials. The hole transport region may include a hole injection layer (HIL), a hole transport layer (HTL), an emission auxiliary layer, an electron blocking layer (EBL), or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 180 as shown in FIG. 2 in each stated order.

The hole transport region may include the compound represented by Formula 201, the compound represented by Formula 202, or a combination thereof:

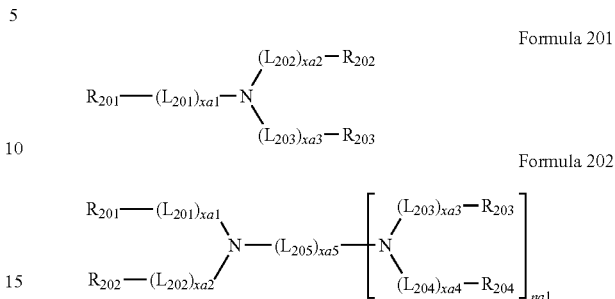

wherein, in Formulae 201 and 202, $L_{201}$ to $L_{204}$ may each independently be a $C_3$-$C_{60}$ carbocyclic group that is unsubstituted or substituted with at least one of $R_{10a}$ or a $C_1$-$C_{60}$ heterocyclic group that is unsubstituted or substituted with at least one of $R_{10a}$, $L_{205}$ may be *—O—*', *—S—*', *—N($Q_{201}$)—*', a $C_1$-$C_{20}$ alkylene group that is unsubstituted or substituted with at least one of $R_{10a}$, a $C_2$-$C_{20}$ alkenylene group that is unsubstituted or substituted with at least one of $R_{10a}$, a $C_3$-$C_{60}$ carbocyclic group that is unsubstituted or substituted with at least one of $R_{10a}$, or a $C_1$-$C_{60}$ heterocyclic group that is unsubstituted or substituted with at least one of $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one of $R_{10a}$ or a $C_1$-$C_{60}$ heterocyclic group that is unsubstituted or substituted with at least one of $R_{10a}$, $R_{201}$ and $R_{202}$ may optionally be bound to each other via a single bond, a $C_1$-$C_5$ alkylene group that is unsubstituted or substituted with at least one of $R_{10a}$, or a $C_2$-$C_5$ alkenylene group that is unsubstituted or substituted with at least one of $R_{10a}$ to form a $C_8$-$C_{60}$ polycyclic group (e.g., a carbazole group or the like) that is unsubstituted or substituted with at least one of $R_{10a}$ (e.g., Compound HT16 described herein), $R_{203}$ and $R_{204}$ may optionally be bound to each other via a single bond, a $C_1$-$C_5$ alkylene group that is unsubstituted or substituted with at least one $R_{10a}$, or a $C_2$-$C_5$ alkenylene group that is unsubstituted or substituted with at least one of $R_{10a}$ to form a $C_8$-$C_{60}$ polycyclic group that is unsubstituted or substituted with at least one of $R_{10a}$, na1 may be an integer from 1 to 4.

In some embodiments, Formulae 201 and 202 may each include at least one of groups represented by Formulae CY201 to CY217:

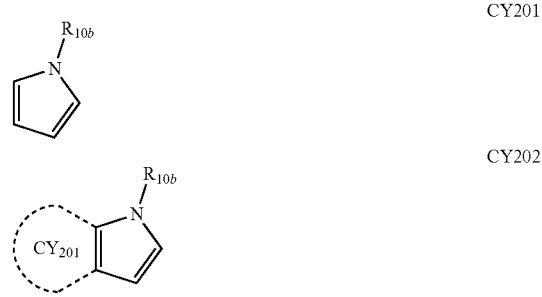

-continued

CY203 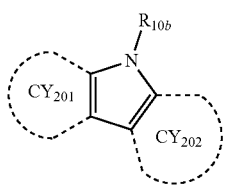

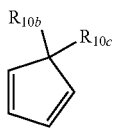

CY204 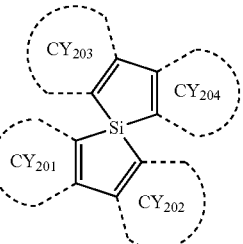

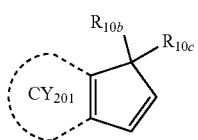

CY205 

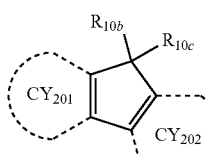

CY206 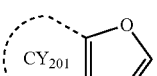

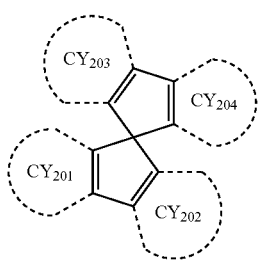

CY207 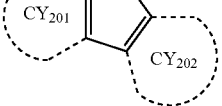

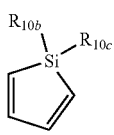

CY208 

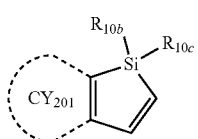

CY209 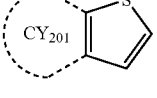

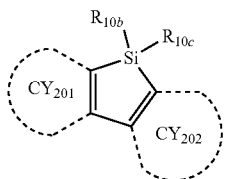

CY210 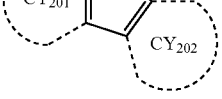

CY211

CY212

CY213

CY214

CY215

CY216

CY217 wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one of groups represented by Formula CY201 to CY203.

In one or more embodiments, Formula 201 may include at least one of groups represented by Formulae CY201 to CY203, and at least one of groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In one or more embodiments, Formula 201 and 202 may each not include groups represented by Formulae CY201 to CY203.

In one or more embodiments, Formula 201 and 202 may each not include groups represented by Formulae CY201 to CY203, and include at least one of groups represented by Formulae CY204 to CY217.

In one or more embodiments, Formula 201 and 202 may each not include groups represented by Formulae CY201 to CY217.

In some embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

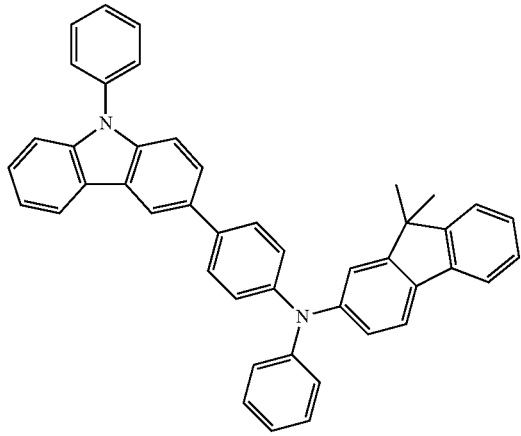
HT1

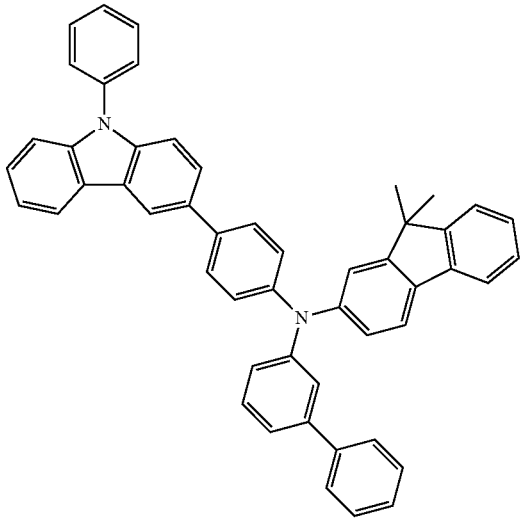
HT2

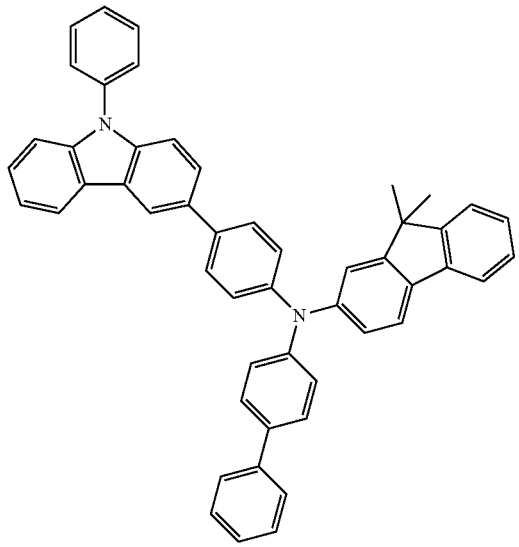
HT3

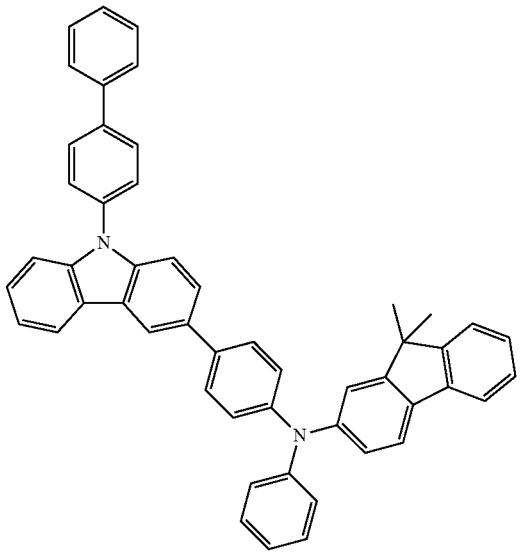
HT4

HT5
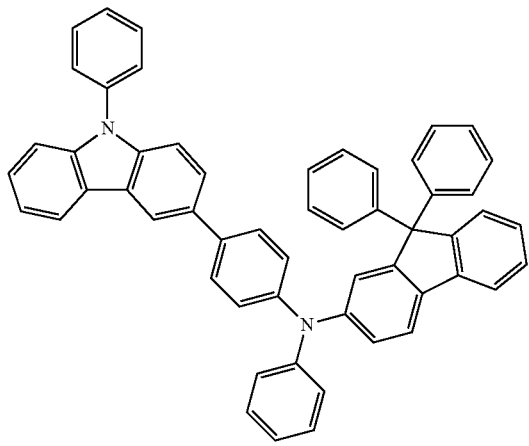
HT6
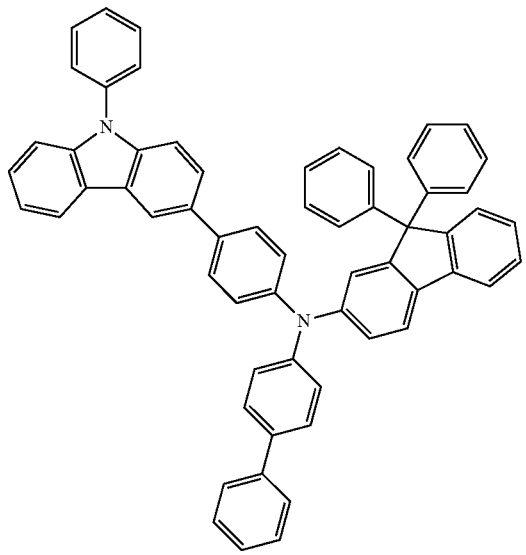
HT7
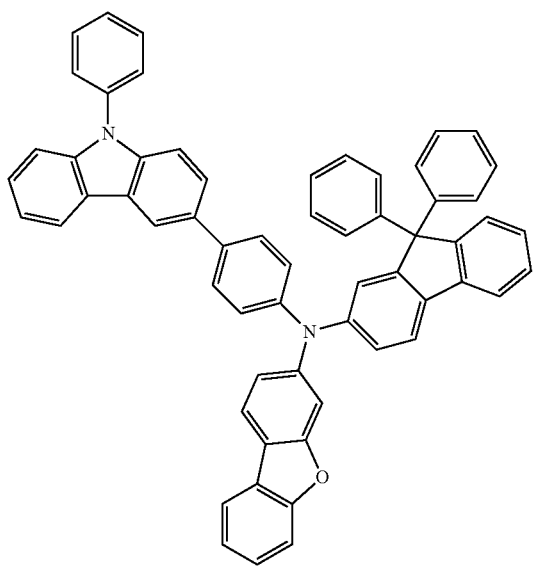
HT8
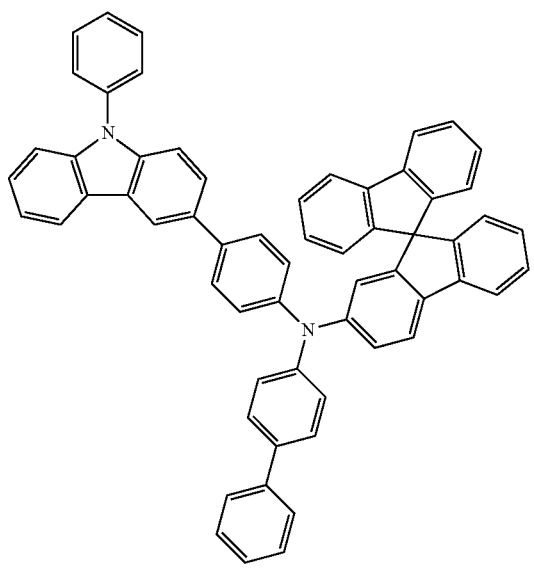

HT9
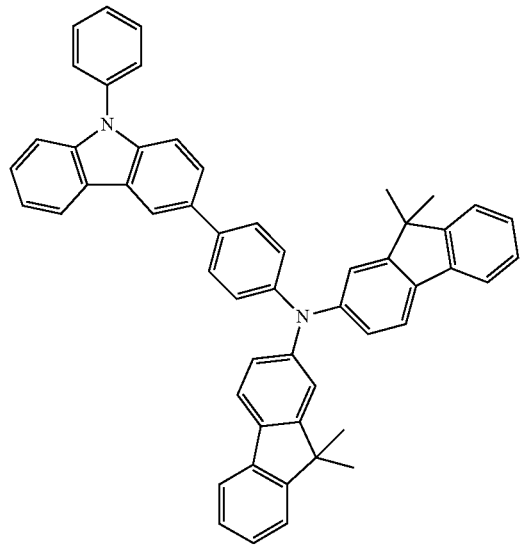
HT10
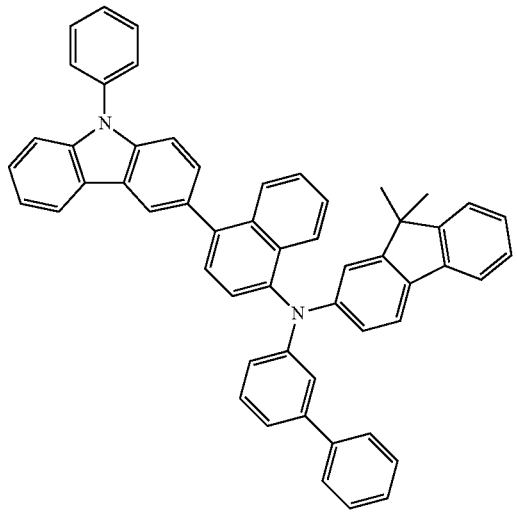
HT11
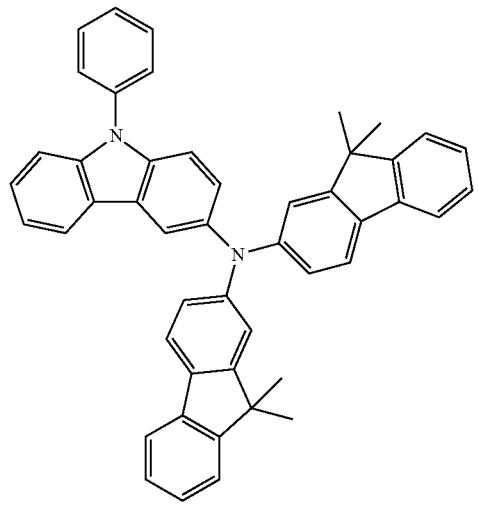
HT12
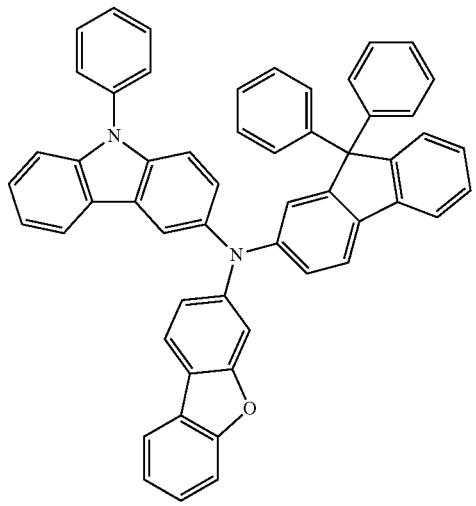
HT13
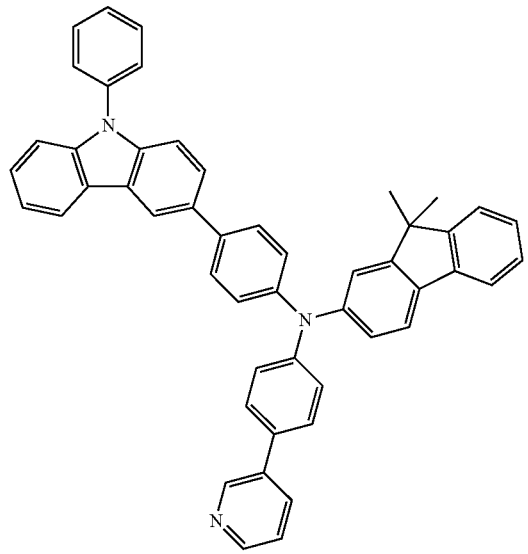
HT14
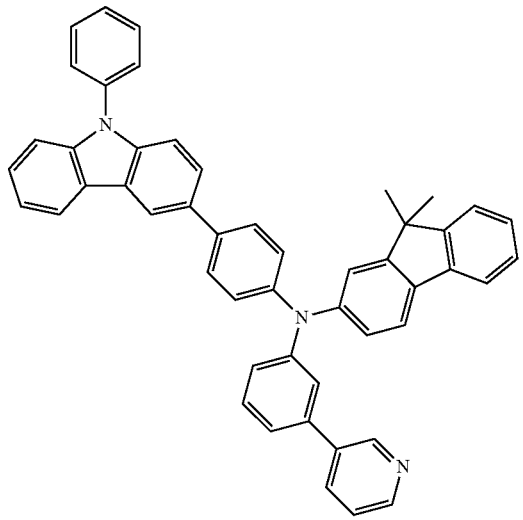

-continued
HT15
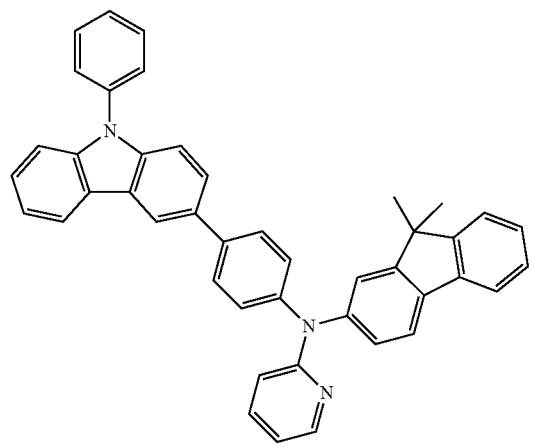
HT16
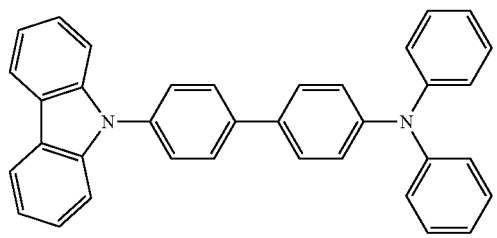
HT17
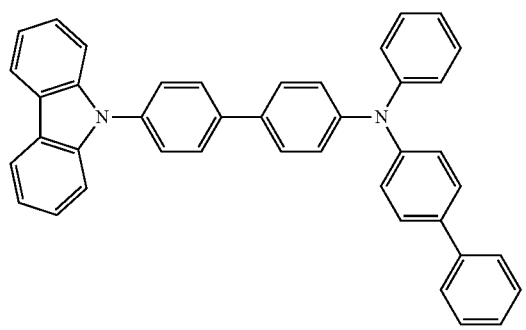
HT18
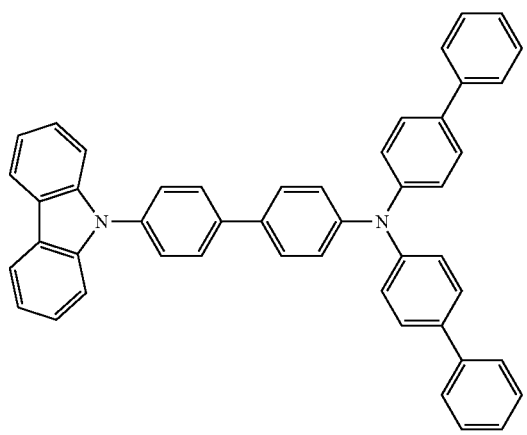
HT19
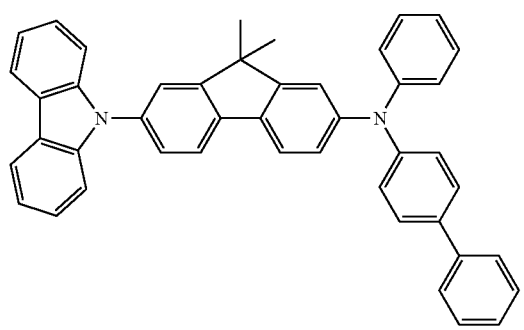
HT20
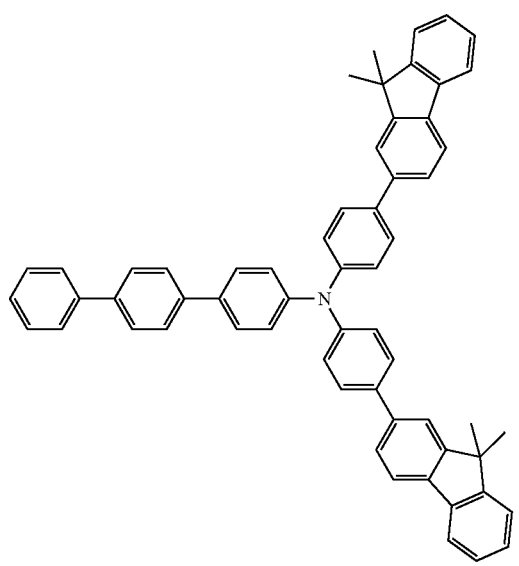

HT21
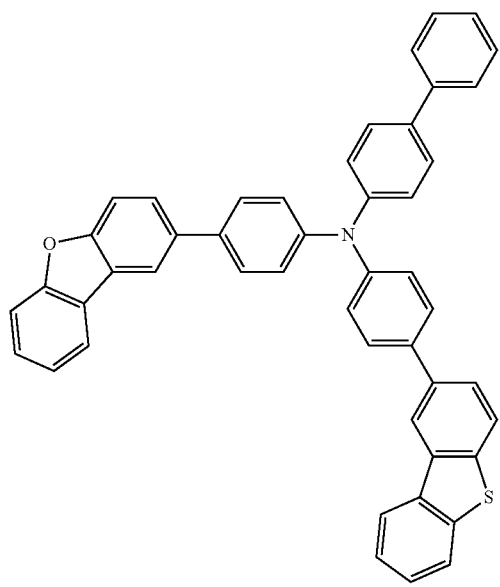
HT22
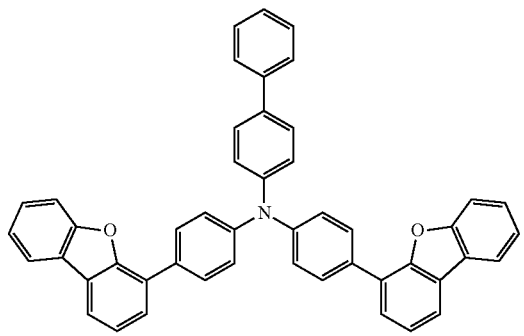
HT23
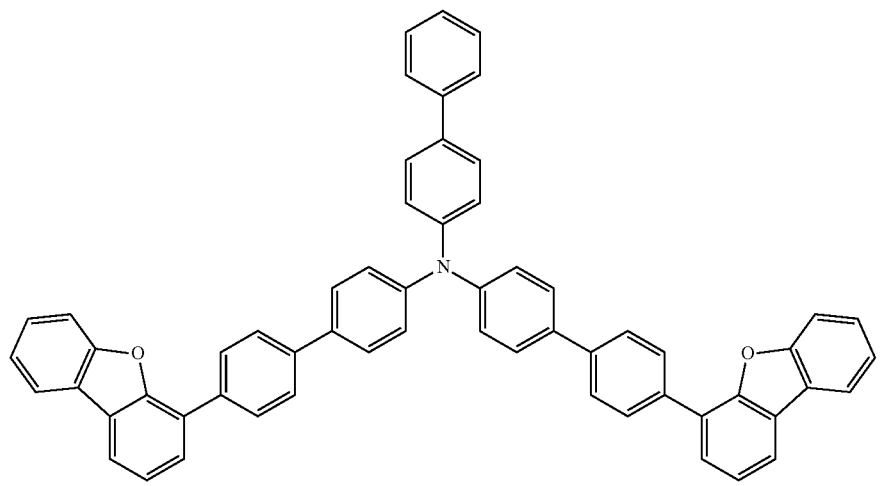
HT24
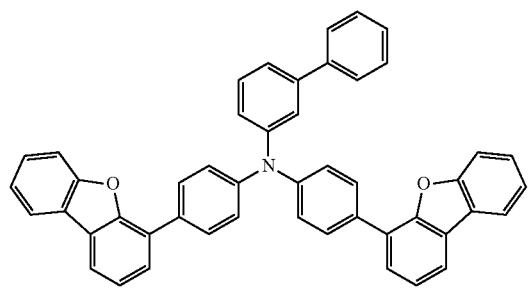
HT25
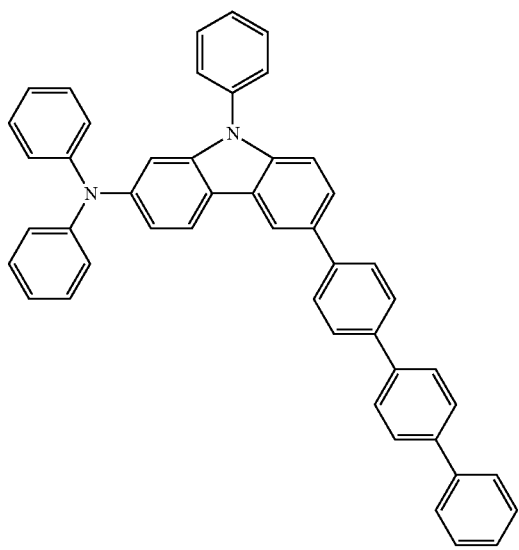

-continued
HT26
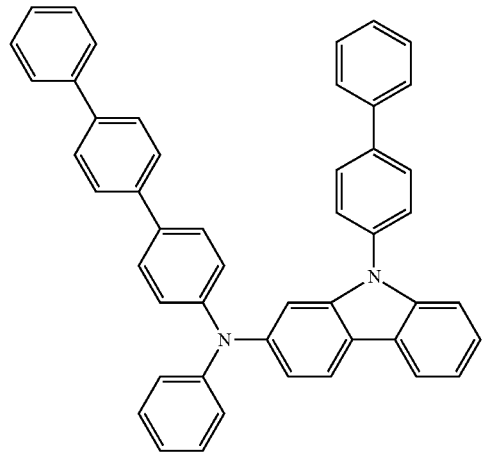
HT27
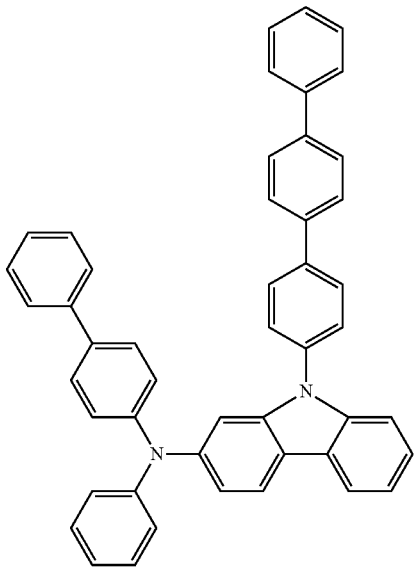
HT28
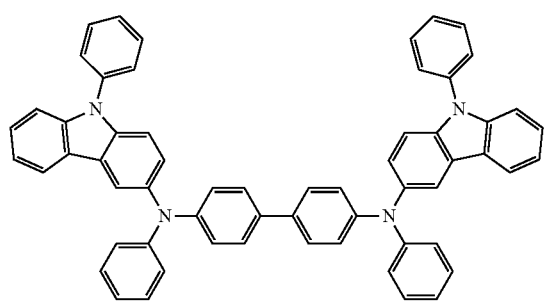
HT29
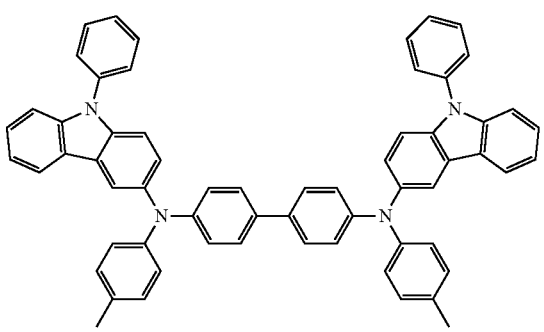
HT30
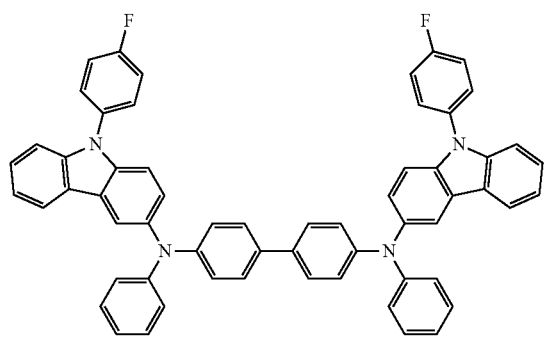
HT31
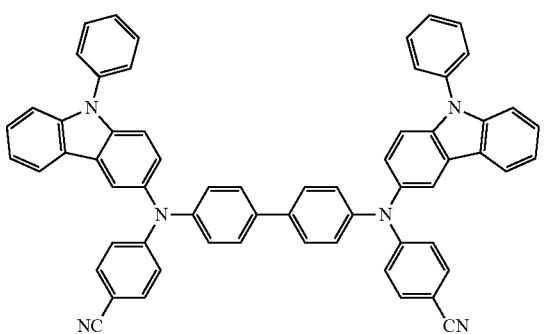

-continued
HT32
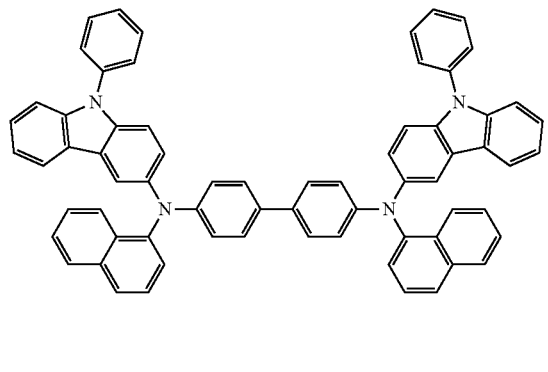
HT33
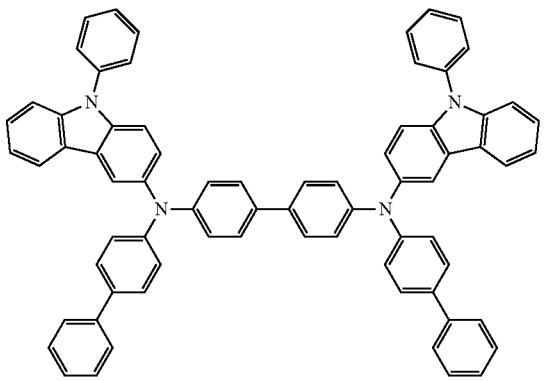
HT34
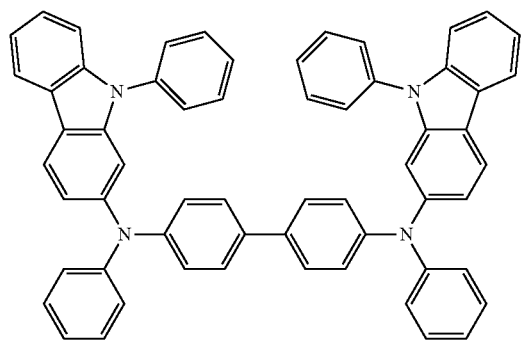
HT35
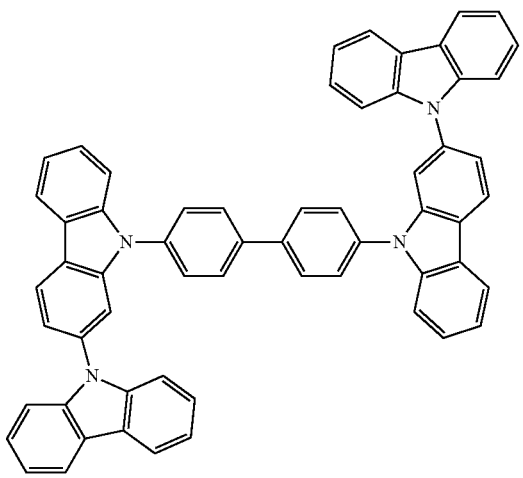
HT36
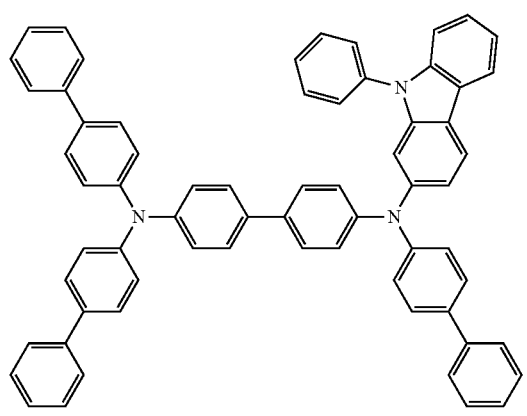
HT37
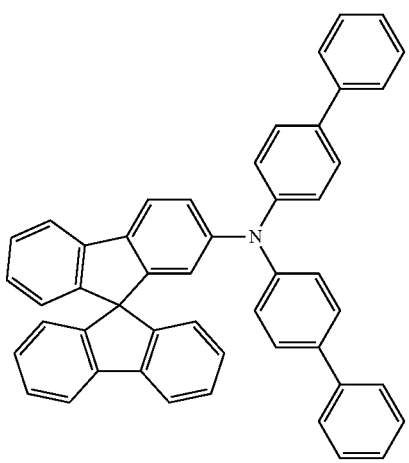

-continued
HT38
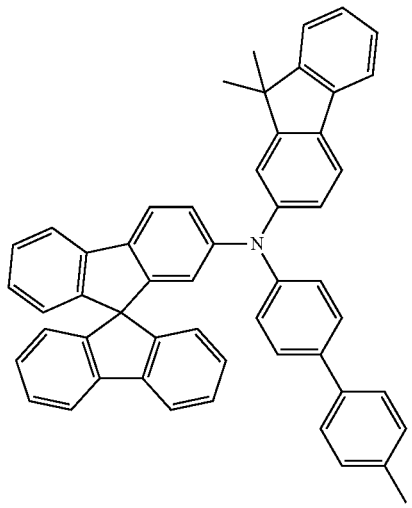
HT39
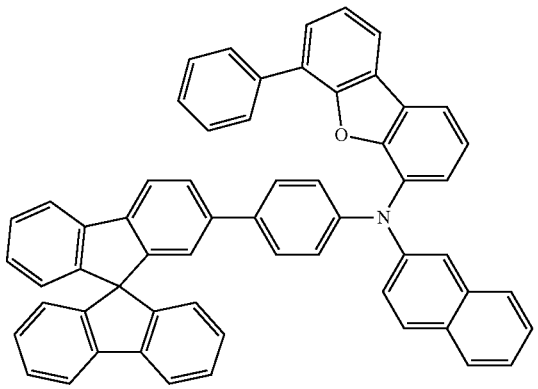
HT40
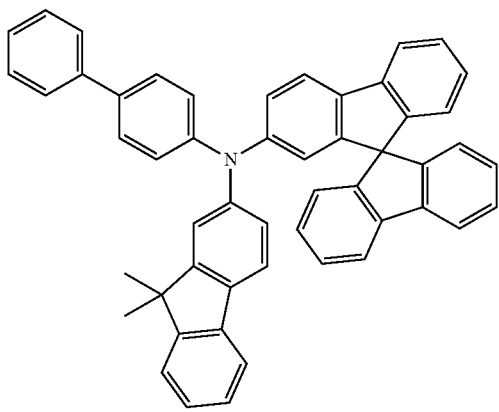
HT41
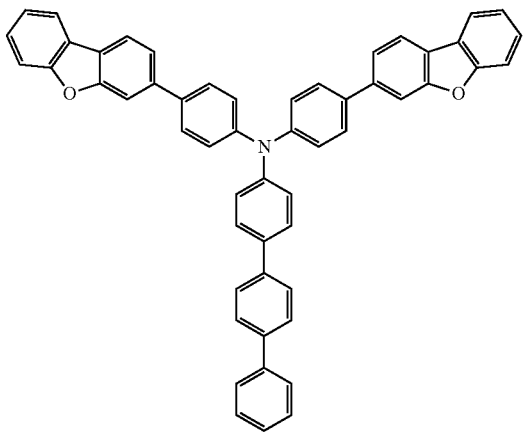
HT42
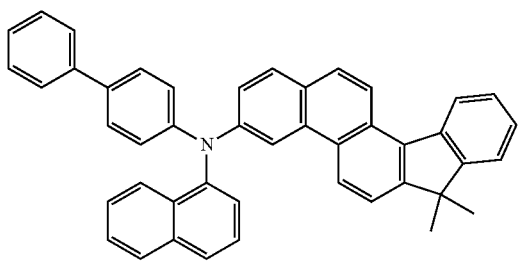
HT43
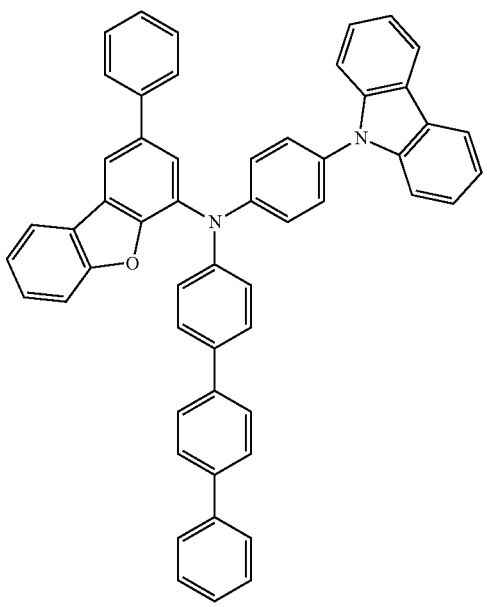

HT44
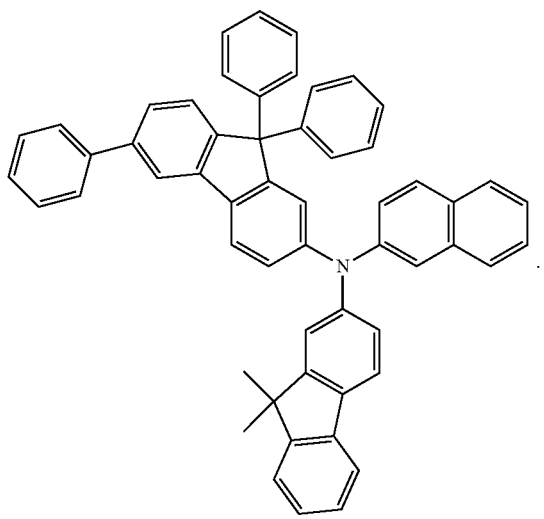
HT45
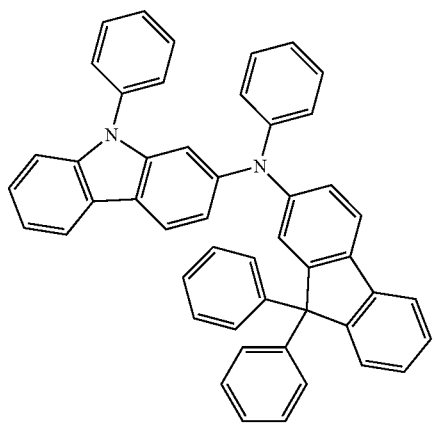
HT46
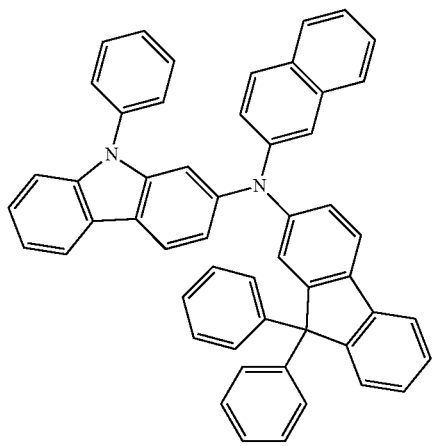
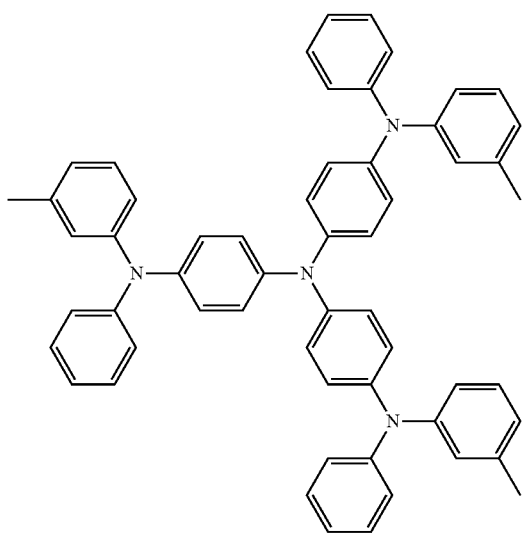
m-MTDATA
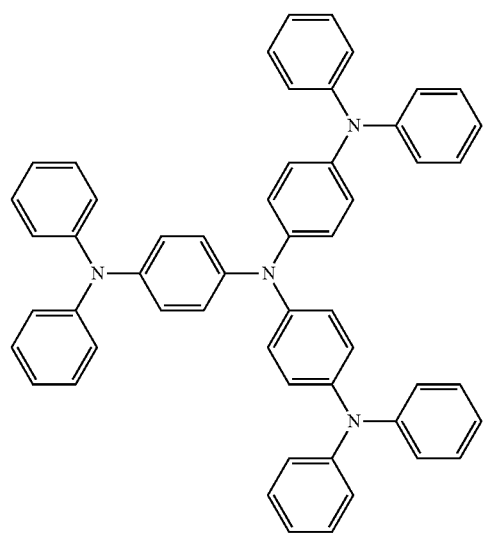
TDATA -continued
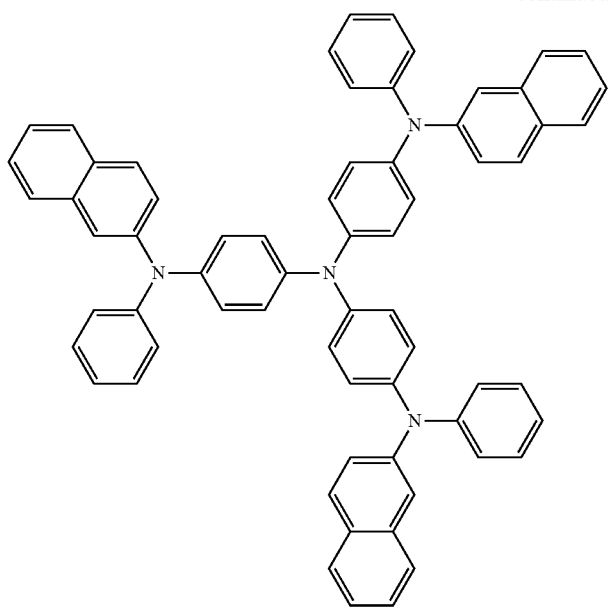
2-TNATA
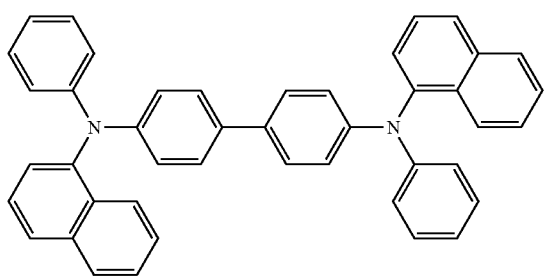
NPB
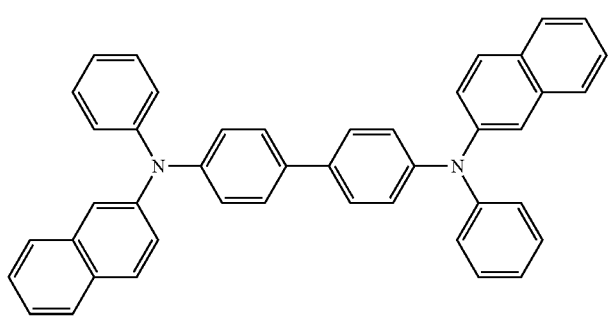
β-NPB
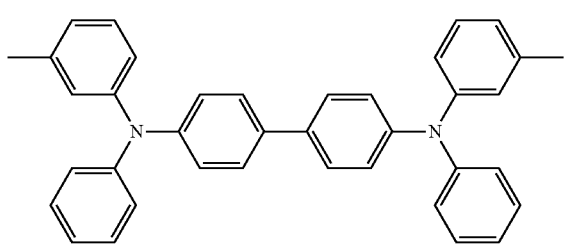
TPD
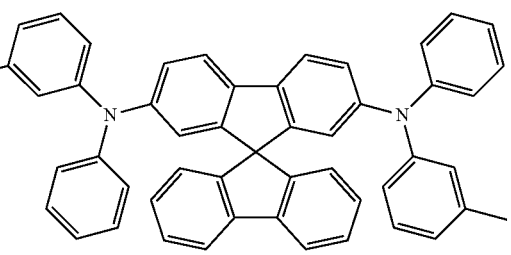
Spiro-TPD -continued

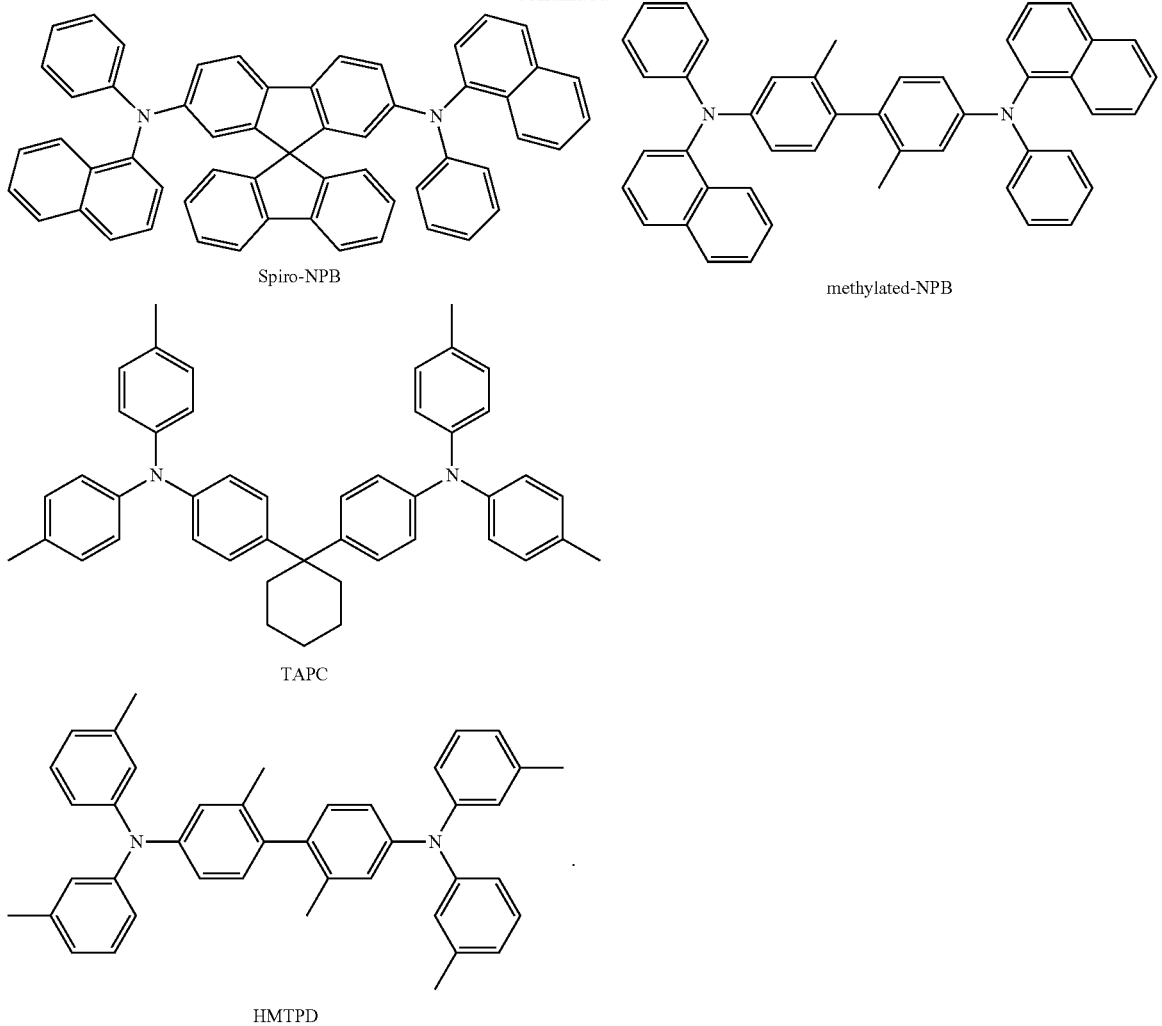

The thickness of the hole transport region may be in a range of about 50 Angstroms (Å) to about 10,000 Å, for example, about 100 Å to about 4,000 Å. When the hole transport region includes a hole injection layer, a hole transport layer, and any combination thereof, the thickness of the hole injection layer may be in a range of about 100 Å to about 9,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

Dispersant

The ink composition may further include a dispersant to improve the degree of dispersion of the hole injection layer compound. The dispersant may be a resin type dispersant, such as a phosphoric acid ester-based dispersant, a urethane-based dispersant, an acrylic dispersant, or the like. In particular, the commercially available dispersant may include DISPER BYK-103, DISPER BYK-110, DISPER BYK-111, DISPER BYK-2000, DISPER BYK-2001, DISPER BYK-2011, DISPER BYK-2070, DISPER BYK-2150, DISPER BYK-160, DISPER BYK-161, DISPER BYK-162, DISPER BYK-163, DISPER BYK-164, and DISPER BYK-166 available from BYK-Chemie GmbH.

The content of the dispersant may be in a range of about 10 parts by weight to about 50 parts by weight, or for example, about 15 parts by weight to about 30 parts by weight, based on 100 parts by weight of the hole injection layer ink composition.

In addition, the ink composition may further include an adhesion promoter for increasing adhesion to a substrate, a leveling agent for improving coating properties, an antioxidant, an ultraviolet absorber, or a combination thereof.

The adhesion promoter may be added to enhance adhesion to a substrate. Examples of the adhesion promoter may include a silane coupling agent having a reactive substituent selected from a carboxyl group, a meth-acryloyl group, an isocyanate group, an epoxy group, and a combination thereof, but embodiments are not limited thereto. For example, the silane coupling agent may be trimethoxysilyl benzoate, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, or any combination thereof.

Examples of the leveling agent include a silicon-based compound, a fluorine-based compound, a siloxane-based compound, a nonionic surfactant, an ionic surfactant, and a titanate coupling agent, but embodiments are not limited thereto. For example, the leveling agent may be a silicon-based compound and/or a fluorine-based compound.

Examples of the silicon-based compound include dimethyl silicon, methyl silicon, phenyl silicon, methyl phenyl silicon, alkyl-modified silicon, alkoxy-modified silicon, and polyether-modified silicon, but embodiments are not limited thereto. For example, the silicon-based compound may be dimethyl silicon or methyl phenyl silicon.

Examples of the fluorine-based compound include polytetrafluorethylene, polyvinylidene fluoride, fluoroalkyl methacrylate, perfluoropolyether, and perfluoroalkylethylene oxide, but embodiments are not limited thereto. For example, the fluorine-based compound may be polytetrafluorethylene.

Examples of the siloxane-based compound include dimethyl siloxane compound (Product No: KF96L-1, KF96L-5, KF96L-10, or KF96L-100 available from Shinetsu Silicone), but embodiments are not limited thereto.

The leveling agent may be used alone or in combination with two or more types thereof.

A content of the leveling agent may vary depending on the desired performance, and the content may be in a range of about 0.001 weight percent (wt %) to about 5 wt %, or for example, about 0.001 wt % to about 1 wt %, based on the total weight of the ink composition. When the content of the leveling agent is within this range, flowability and uniformity of a film in the ink composition may be improved.

Since the ink composition may have excellent inkjet ejection stability, for example, the ink composition may be an ink composition for inkjet, but embodiments are not limited thereto.

Solution Process

The ink composition may be used to manufacture a light-emitting apparatus by a solution process.

The ink composition may be provided by a solution process on a substrate including an emission area on which the first electrode and the second electrode may be disposed.

The solution process may be performed by a spin coating method, a slit coating method, a drop casting method, a casting method, a gravure coating method, a bar coating method, a roll coating method, a dip coating method, a spray coating method, a screen coating method, a flexoprinting method, an offset printing method, an inkjet printing method, or a nozzle printing method, but embodiments are not limited thereto.

For example, the solution process may be performed by a spin coating method, a slit coating method, or an inkjet printing method, but embodiments are not limited thereto.

For example, the ink composition may be provided in the form of a film by spin coating on a substrate on which the first electrode and the second electrode may be disposed or may be provided in the form of microdroplets by inkjet printing. Because the ink composition exhibits excellent inkjet ejection stability, the ink composition may be suitable for inkjet printing.

The inkjet printing method may use an inkjet printer having an inkjet head equipped with a piezo-type nozzle that applies pressure according to a voltage. In some embodiments, the ink composition may be ejected from a nozzle of an inkjet head onto the substrate. The ejection amount of the ink composition may be in a range of about 1 picoliter per time (pL/time) to about 50 pL/time, for example, about 1 pL/time to about 30 pL/time, or for example, 1 pL/time to 20 pL/time.

An aperture diameter of the inkjet head may be about 5 micrometers (μm) to about 50 μm, for example, about 10 μm to about 30 μm to reduce nozzle clogging and improve ejection precision, but embodiments are not limited thereto.

An ejection pressure of the inkjet head may be 1,000 $s^{-1}$ to 10,000 $s^{-1}$ based on the shear rate, but embodiments are not limited thereto.

A temperature at a point of forming a coating film is not particularly limited, but from a viewpoint of suppressing crystallization of materials contained in the ink composition, the temperature may be in a range of about 10° C. to about 50° C., about 15° C. to about 40° C., about 15° C. to about 30° C., or for example, about 20° C. to about 25° C.

General Definitions of Terms

The term "$C_3$-$C_{60}$ carbocyclic group" as used herein refers to a cyclic group consisting of ring carbon atoms only and having 3 to 60 carbon atoms. The term "$C_1$-$C_{60}$ heterocyclic group" as used herein refers to a cyclic group having 1 to 60 carbon atoms in addition to a ring heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the $\pi$ electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the $\pi$ electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "$\pi$ electron-rich $C_3$-$C_{60}$ cyclic group", or "$\pi$ electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ hetero cycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ hetero cycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$R_{10a}$" as used herein may be:
  deuterium, —F, —Cl, —Br, —I, a hydroxyl group, a cyano group, or a nitro group;
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;
  a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each of which is independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or
  —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
  wherein $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each of which is independently unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

The term "heteroatom" as used herein refers to any atom other than a carbon atom. Examples of the heteroatom may include O, S, N, P, Si, B, Ge, Se, or any combination thereof.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a connection site to an adjacent atom in a corresponding formula, e.g., an adjacent atom of a polymer compound.

EXAMPLES

Preparation of Hole Injection Layer Ink Composition

Example 1

A hole injection layer compound, 2-TNATA (0.01 wt %), BYK-161 (0.01 wt %) as a dispersant, and diethylene glycol monophenylether (99.98 wt %) as a solvent were mixed together to prepare a first mixture solution. The dispersant was added to the mixture as a 1.0 wt % BYK-161 solution in the solvent. The first mixture solution was then ultrasonically treated in a bath for 20 minutes to provide a first dispersing liquid.

RHEOBYK-430 as an polymer compound (available from BYK) (as 1.0 wt % solution in solvent) was added to the first dispersing liquid such that the concentration of the RHEOBYK-430 in a second mixture solution was 0.2 wt %. The second mixture solution was ultrasonically treated for 20 minutes in a bath, followed by strong stirring at a temperature of 70° C. for 120 minutes. Thereafter, the temperature was allowed to come to room temperature and strongly stirred for an additional 30 minutes, thereby providing a hole injection layer ink composition.

Comparative Example 1

A hole injection layer ink composition was prepared in substantially the same manner as Example 1, except that polystyrene (0.2 wt %) was used as a polymer compound in preparing the ink composition.

Manufacture of Organic Light-Emitting Device

Example 2

A glass substrate of ITO 300 Å/Ag 50 Å/ITO 300 Å (anode) was cut to a size of 50 millimeters (mm)×50 mm×0.7 mm, ultrasonically cleaned by using isopropyl alcohol (5 minutes) followed by pure water (5 minutes), and irradiated with UV light for 30 minutes. Then, the glass substrate was exposed to ozone and loaded into a vacuum deposition apparatus.

A pixel-defining film was formed by photolithography such that an electrode was exposed on the substrate.

The substrate was treated with $O_2$ plasma ($O_2$:$N_2$=5:95 100 W) for 50 seconds to remove a residue of the electrode, followed by treatment with $CF_4$ plasma for 60 seconds.

A hole injection layer was formed on the exposed electrode with the hole injection layer ink composition of Example 1 to a thickness of 600 Å by using an inkjet process. Subsequently, a hole transport material 4,4'-bis[N-(1-naphthyl)-N-phenylamino]biphenyl (hereinafter, referred to as "NPB") was deposited on the hole injection layer to a thickness of 300 Å by using an inkjet process. 9,10-di(naphthalen-2-yl)anthracene (hereinafter referred to as "DNA") as a blue fluorescent host and 4,4'-bis[2-(4-(N,N-diphenylamino)phenyl)vinyl]biphenyl (hereinafter referred to as "DPAVBi") as a blue fluorescent dopant were deposited on the hole transport layer in a weight ratio of about 98:2, respectively, to form an emission layer having a thickness of 300 Å by using an inkjet process.

Alq$_3$ was deposited on the emission layer to form an electron transport layer having a thickness of 300 Å. LiF, which is halogenated alkali metal, was then deposited on the electron transport layer to form an electron injection layer having a thickness of 10 Å. Finally, Al was vacuum-deposited on the electron injection layer to form a cathode having a thickness of 3,000 Å to form an LiF/Al electrode, to provide an organic light-emitting device.

After the plasma treatment, methyl benzoate was dropped on the pixel-defining film, and the contact angle was measured. The contact angle was found to be more than 55°, and thus liquid repellency was confirmed.

Comparative Example 2

An organic light-emitting device was manufactured in substantially the same manner as in Example 1, except that plasma treatment was not performed after forming the pixel-defining film.

Comparative Example 3

An organic light-emitting device was manufactured in substantially the same manner as in Example 1, except that the hole injection layer ink composition of Comparative Example 1 was used in forming a hole injection layer.

Viscosity Value Measurement

For the ink compositions prepared in Example 1 and Comparative Example 1, the viscosity at a shear rate of 0.1 s$^{-1}$ to 1,000 s$^{-1}$ was measured using a rotational viscosity measurement method known to those of skill in the art. A rotational viscometer DV-I Prime Brookfield rheometer was used as a measuring device, and the average value after five repeat measurements are listed in Table 1.

TABLE 1

| Shear rate (s$^{-1}$) | Viscosity (Ex. 1) | Viscosity (Comp. Ex. 1) |
|---|---|---|
| 0.1 | 12 cP | 4.0 cP |
| 100 | 2.5 cP | 3.8 cP |

From the results of Table 1, the viscosity of the hole injection layer ink composition in Example 1 varies greatly with a change of shear rate. Specifically, the hole injection layer ink composition of Example 1 has a lower viscosity at the higher shear rate. Because of the lower viscosity the hole injection layer ink composition of Example 1 is deposited with less difficulty in the inkjet process. In addition, the hole injection layer ink composition of Example 1 has a high viscosity at a low shear rate. Accordingly, the hole injection layer ink composition ejected in the inkjet process can maintain a high viscosity on the electrode in the absence of an external shear force, and thus, the hole injection layer ink composition has improved wettability.

Luminescence efficiency of each light-emitting device of Example 2 and Comparative Examples 2 and 3 were measured using a luminance meter PR650 at 700 nit. The results thereof are shown in Table 2.

TABLE 2

| | Plasma Descum | HI layer ink composition | Driving voltage (V) | Luminance (cd/m$^2$) | Efficiency (cd/A/y) | Emission color | Lifespan (hr @ 90% luminance) |
|---|---|---|---|---|---|---|---|
| Ex. 2 | yes | Ex. 1 | 5.0 | 269 | 60.6 | Blue | 14 |
| Comp. Ex. 2 | no | Ex. 1 | 4.8 | 285 | 45.2 | Blue | 7 |
| Comp. Ex. 3 | yes | Comp. Ex. 1 | 4.5 | 286 | 50.3 | Blue | 10 |

Referring to the results of Table 2, the organic light-emitting device of Example 2 was found to have improved characteristics, as compared with the organic light-emitting devices of Comparative Examples 2 and 3.

Specifically, when the organic light-emitting device of Comparative Example 2 was manufactured without descumming, for example, a plasma process. Thus, performance of the organic light-emitting device was deteriorated due to the residues on the electrode.

Specifically, the organic light-emitting device of Comparative Example 3 exhibits poor device performance due to poor wettability since the hole injection layer ink composition ejected by the inkjet has a low viscosity on the electrode without external force.

As apparent from the foregoing description, a light-emitting device including hole injection layer prepared according to a method of forming a hole injection layer of a light-emitting device was found to have excellent efficiency and lifespan, as compared with a light-emitting device including a hole injection layer in the related art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a hole injection layer of a light-emitting device, the method comprising:
    forming a pixel electrode on a substrate;
    coating the pixel electrode with a composition to provide a pixel-defining film on the pixel electrode;
    forming by photolithography a patterned pixel-defining film having an opening that exposes a portion of the pixel electrode;
    descumming; and
    forming the hole injection layer on the exposed and descummed pixel electrode with a hole injection composition, wherein the hole injection composition comprises a hole injection layer compound, a solvent, and a polymer compound comprising a group represented by Formula 1:

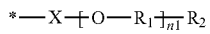

Formula 1 wherein, in Formula 1,
X is a single bond or a divalent organic linking group,
$R_1$ is a $C_1$-$C_{10}$ alkylene group that is unsubstituted or substituted with at least one of $R_{10a}$,
$R_2$ is hydrogen, deuterium, a hydroxyl group, a $C_1$-$C_{60}$ alkyl group that is unsubstituted or substituted with at least one of $R_{10a}$, a $C_2$-$C_{60}$ alkenyl group that is unsubstituted or substituted with at least one of $R_{10a}$, a $C_2$-$C_{60}$ alkynyl group that is unsubstituted or substituted with at least one of $R_{10a}$, a $C_1$-$C_{60}$ alkoxy group that is unsubstituted or substituted with at least one of $R_{10a}$, and a $C_1$-$C_{60}$ alkylether group that is unsubstituted or substituted with at least one of $R_{10a}$,
l1 is an integer from 2 to 100,
indicates a connection site to an adjacent atom of the polymer compound, and
each $R_{10a}$ is independently deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each of which is independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each of which is independently unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof,
wherein the polymer compound comprises a polyurethane unit, a polyamide unit, a polyurea unit, or a combination thereof, and
wherein a content of the polymer compound in the hole injection composition is in a range of about 0.05 percent by weight to about 1 percent by weight based on a total composition of the hole injection composition.

2. The method of claim 1, wherein the descumming comprises plasma treatment.

3. The method of claim 1, wherein the descumming comprises plasma treatment with a fluorine-containing gas.

4. The method of claim 1, wherein the descumming comprises plasma treatment with $CF_4$, $NF_3$, $SF_6$, $C_3F_8$, $C_4F_8$, or any combination thereof.

5. The method of claim 1, wherein the descumming comprises:
plasma treatment with $O_2$, $N_2$, or a combination thereof; and
$CF_4$, $NF_3$, $SF_6$, $C_3F_8$, $C_4F_8$, or a combination thereof.

6. The method of claim 1, wherein the forming of the hole injection layer on the exposed pixel electrode is conducted using a solution process.

7. The method of claim 1, wherein the polymer compound and the solvent form a reversible network structure by hydrogen bonding.

8. The method of claim 1, wherein the polymer compound comprises the at least one group represented by Formula 1 as at least one side chain or at least one terminus of the polymer compound.

9. The method of claim 1, wherein, in Formula 1, $R_2$ is a $C_1$-$C_{20}$ alkyl group substituted with a terminal hydroxyl group or a $C_1$-$C_{20}$ alkylether group substituted with a terminal hydroxyl group.

10. The method of claim 1,
$R_2$ is a group represented by Formula 2:

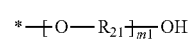

Formula 2 wherein, in Formula 2,
$R_{21}$ is a $C_1$-$C_{10}$ alkylene group that is unsubstituted or substituted with at least one of $R_{10a}$,
m1 is an integer from 1 to 10,
indicates a connection to $R_1$, and
$R_{10a}$ of Formula 2 is defined as $R_{10a}$ of Formula 1.

11. The method of claim 1, wherein a number average molecular weight of the polymer compound is in a range of about 100 grams per mole to about 100,000 grams per mole, and a weight average molecular weight of the polymer compound is in a range of about 1,500 grams per mole to about 1,000,000 grams per mole.

12. The method of claim 1, wherein the solvent comprises alkylene glycol alkyl ethers, diethylene glycol dialkyl ethers, triethylene glycol monoalkyl ethers, triethylene glycol dialkyl ethers, aromatic ethers, alkylene glycol alkylether acetates, alkoxy alkyl acetates, ketones, alcohols, esters, cyclic esters, or an combination thereof.

13. The method of claim 1, wherein the hole injection composition has a viscosity in a range of about 30 centipoise to about 1,000 centipoise at a shear rate in a range of about 0.05 s$^{-1}$ to about 0.15 s$^{-1}$, and a viscosity in a range of about 7 centipoise to about 13 centipoise at a shear rate in a range of about 70 s$^{-1}$ to 130 s$^{-1}$.

14. A method of forming a hole injection layer of a light-emitting device, the method comprising:
forming a pixel electrode on a substrate;
coating the pixel electrode with a composition to provide a pixel-defining film on the pixel electrode;

forming by photolithography a patterned pixel-defining film having an opening that exposes a portion of the pixel electrode;
descumming; and
forming the hole injection layer on the exposed and descummed pixel electrode with a hole injection composition,
wherein the hole injection composition comprises a hole injection layer compound, a solvent, and a polymer compound comprising at least one group represented by Formula 3:

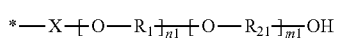

Formula 3 wherein, in Formula 3,
X is a single bond or a divalent organic linking group,
$R_1$ and $R_{21}$ are each independently a $C_1$-$C_{10}$ alkylene group that is unsubstituted or substituted with at least one of $R_{10a}$,
n1 is an integer from 2 to 100,
m1 is an integer from 1 to 10,
* indicates a connecting site to an adjacent atom of the polymer compound, and
each $R_{10a}$ is independently deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each of which is independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each of which is independently unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

15. The method of claim 14, wherein the descumming comprises plasma treatment with $CF_4$, $NF_3$, $SF_6$, $C_3F_8$, $C_4F_8$, or any combination thereof, and
the forming of the hole injection layer on the exposed pixel electrode is conducted using a solution process, and,
the content of the polymer compound in the hole injection composition is in a range of about 0.05 percent by weight to about 0.5 percent by weight based on a total composition of the hole injection composition.

* * * * *